United States Patent [19]

Matsuzaki et al.

[11] Patent Number: 5,493,129
[45] Date of Patent: Feb. 20, 1996

[54] THIN FILM TRANSISTOR STRUCTURE HAVING INCREASED ON-CURRENT

[75] Inventors: Eiji Matsuzaki, Yokohama; Akihiro Kenmotsu, Fujisawa; Yoshifumi Yoritomi, Yokohama; Toshiyuki Koshita, Yokohama; Takao Takano, Yokohama; Mitsuo Nakatani, Yokohama, all of Japan

[73] Assignee: Hitachi, Ltd., Tokyo, Japan

[21] Appl. No.: 372,289

[22] Filed: Jun. 27, 1989

[30] Foreign Application Priority Data

Jun. 29, 1988 [JP] Japan .................. 63-159098
Jun. 29, 1988 [JP] Japan .................. 63-159102

[51] Int. Cl.⁶ .................................................. H01L 29/04
[52] U.S. Cl. .................................. 257/61; 257/352
[58] Field of Search ............................ 340/718, 719,
340/784; 350/333, 334, 336; 357/4, 2, 23.7;
257/57, 61, 347, 352; 359/59, 54

[56] References Cited

U.S. PATENT DOCUMENTS

| 4,431,271 | 2/1984 | Okubo | 350/334 |
| 4,597,001 | 6/1986 | Borstscheller | 357/23.7 |
| 4,686,553 | 8/1987 | Possin | 357/23.7 |
| 4,804,953 | 2/1989 | Castleberry | 350/333 |

FOREIGN PATENT DOCUMENTS

| 59-50564 | 3/1984 | Japan . |
| 59-113666 | 6/1984 | Japan . |
| 60-17962 | 1/1985 | Japan . |
| 61-17116 | 1/1986 | Japan . |
| 62-67872 | 3/1987 | Japan . |

OTHER PUBLICATIONS

Newest Amorphous Silicon Handbook, 1983, p. 386.

Primary Examiner—Richard Hjerpe
Assistant Examiner—Chanh Nguyen
Attorney, Agent, or Firm—Kenyon & Kenyon

[57] ABSTRACT

A thin film transistor structure for use in driving liquid crystal display elements has a semiconductor active layer, a control electrode layer underlying the active layer with an insulating layer interposed therebetween and first and second main electrode layers formed on or above the active layer in a spaced relation with each other to define a channel in the active layer in cooperation with the control electrode layer between the main electrode layers. The active layer has a first peripheral edge portion generally perpendicular to the direction of the channel and a second peripheral edge portion generally not perpendicular to the direction of the channel. The first and/or second main electrode layer extends over the first and/or second peripheral edge portion of the active layer such that at least a part of the first peripheral edge portion and/or at least part of the second peripheral edge portion of the active layer has its side face directly covered with the main electrode layer.

11 Claims, 16 Drawing Sheets

FIG. IA
PRIOR ART
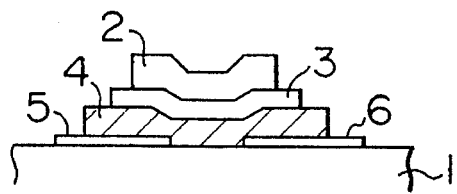
FIG. IB
PRIOR ART
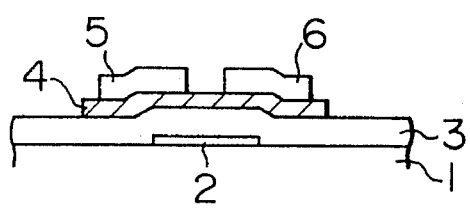
FIG. IC
PRIOR ART
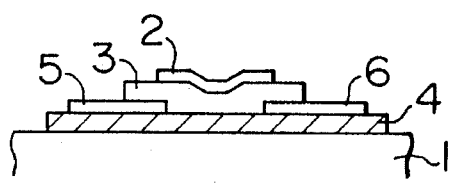
FIG. ID
PRIOR ART
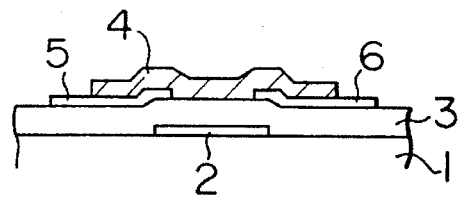
FIG. 2
PRIOR ART
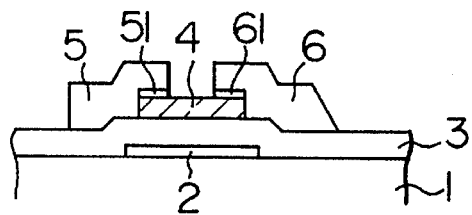
FIG. 3
PRIOR ART
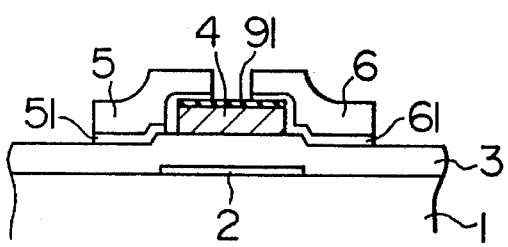

THIN FILM TRANSISTOR STRUCTURE HAVING INCREASED ON-CURRENT

BACKGROUND OF THE INVENTION

This invention relates to a thin film transistor using a semiconductor layer as an active layer and to an active matrix circuit board and image display device each using the transistors.

An amorphous silicon thin film transistor (hereinafter simply referred to as an a-Si TFT) using an amorphous silicon layer (hereinafter simply referred to as an a-Si layer) as an active layer has been highlighted as a switching element of an active matrix driven type display device.

FIGS. 1A to 1D show sectional structures of various a-Si TFT's which have hitherto been proposed (for example, see "Newest Amorphous Handbook", 1983, p. 386). In each of the illustrations of FIGS. 1A to 1D, an a-Si TFT includes an insulating base plate 1, a gate electrode (first electrode) 2, an a-Si layer 4, a drain electrode (second electrode) 5 and a source electrode (third electrode) 6. The TFT's shown in FIGS. 1C and 1D have a disadvantage that because of interposition of the second and third electrodes 5 and 6 between the gate insulating layer 3 and a-Si layer 4 which prevents successive formation of the gate insulating layer 3 and a-Si layer 4 is prevented. The TFT shown in FIG. 1A or 1B especially the structure shown in Fig. 1B has been employed widely.

In the prior art a-Si TFT's, current flows through the a-Si layer not only in a direction perpendicular to the thickness but also in the thickness direction and is therefore liable to be affected by resistance of the a-Si layer and interface state between the a-Si layer and each of the second and third electrodes. This tends to limit on-current. When such TFT's are applied to an active matrix circuit board, non-uniformity of on-current will often occur among the TFT's, thus causing a decrease in production yield.

On the other hand, JP-A-62-67872 discloses an a-Si TFT similar to that shown in FIG. 2. In this prior art TFT, impurity doped layers 51 and 61 are formed in the a-Si layer 4 serving as the active layer with a view to promoting reproducibility of threshold voltage but the literature fails to refer to the relative positional relation between the gate electrode and each of the drain electrode and source electrode.

Further, JP-A-61-17116 discloses an a-Si TFT resembling that shown in FIG. 3. In this prior art TFT, the entire surface of the semiconductor layer such as a-Si layer 4 is covered with an insulating layer 91 of, for example, $Si_3N_4$ and a semiconductor layer such as n-type a-Si layer 51 and 61 are brought into contact with a low resistance portion of the channel in the semiconductor layer 4, in order that off-state resistance of the thin film transistor is increased and its on-state resistance is decreased. However, the literature in no way prescribes the relative positional relation between the gate electrode and each of the drain electrode and source electrode.

JP-A-59-11366 (laid open on Jun. 30, 1984), JP-A-59-50564 (laid open on Mar. 23, 1984) and JP-A-60-17962 (laid open on Jan. 29, 1985) also disclose this film transistors but none of them describe features of the present invention to be detailed hereinafter.

SUMMARY OF THE INVENTION

The present invention solves the problems with the prior art a-Si transistors by providing a thin film transistor structure having increased on-state current and increased off-state resistance.

The present invention provides a thin film transistor structure which is effective to make uniform on-current distribution in an active matrix circuit board including thin film transistors.

According to one embodiment of the present invention, a thin film transistor structure has a control electrode layer formed on a part of an insulating base plate, an insulating layer formed on the control electrode layer and on the base plate, an active layer of a semiconductor material formed on a part of the insulating layer which is on the control electrode layer, and first and second main electrode layers each disposed in an overlap relation to the active layer. The first and second main electrode layers are formed on or above the active layer in a spaced relation with each other to define a channel in the active layer between the main electrodes in cooperation with the control electrode layer. The active layer has a first peripheral edge portion generally perpendicular to the direction of the channel and a second peripheral edge portion generally not perpendicular to the direction of the channel. One or both of the first and second main electrode layers extend over the first peripheral edge portion of the active layer onto the insulating layer such that at least a part of the first peripheral edge portion of the active layer has its side surface directly covered with one or both of the first and second main electrode layers and a part of one or both of the first and second main electrode layers overlap the control electrode layer only with the insulating layer lying therebetween, and the length of the overlapping part of one or both of the first and second main electrode layers as measured in the direction of the channel is not smaller than the thickness of the active layer.

Presumably, by making the length of the overlapping part of one or both of the first and second main electrode layers not smaller than the thickness of the active layer, resistance of the active layer above the control electrode layer can be decreased in comparison with the resistance due to interface resistance between each of the main electrode layers and the active layer and resistance against current flowing in the direction of the thickness of the active layer. Accordingly, current is caused to flow in a direction which is substantially parallel to the control electrode layer and hence is not liable to be affected by the resistance of the active layer and the interface resistance between the active layer and each of the first and second main electrode layers.

According to another embodiment of the present invention, a thin film transistor structure has a control electrode layer formed on a part of an insulating base plate, an insulating layer formed on the control electrode layer and on the base plate, an active layer of a semiconductor material formed on at least a part of the insulating layer which is on the control electrode layer, and first and second main electrode layers each disposed in an overlap relation to the active layer. The first and second main electrode layers are formed on or above the active layer in a spaced relation with each other to define a channel in the active layer between the main electrodes in cooperation with the control electrode layer. The active layer has a first peripheral edge portion generally perpendicular to the direction of the channel and a second peripheral edge portion generally not perpendicular to the direction of the channel. One or both of the first and second main electrode layers extend over the second peripheral edge portion of the active layer onto the insulating layer such that at least a part of the second peripheral edge portion of the active layer has its side surface directly covered with one or both of the first and second main electrode layers.

When voltage is applied to the control electrode layer, a region of the active layer being above and close to the control electrode layer assumes a low resistance. In the aforementioned two structures of the invention, the two main electrode layers electrically contact the active layer at that low resistance region thereof, and consequently the electrical contact connection can be freed from the influence of bulk resistance of the active layer and contact resistance between the active layer and the contacting metal layer and an increased drain current can be obtained. Especially, in the latter structure, the second peripheral edge portion, not perpendicular to the direction of the channel, through which the first and/or second main electrode layer electrically contacts the active layer is so disposed as to lie above, i.e., inside the control electrode layer and has its side surface covered with the first and/or second main electrode layer, thereby ensuring that the side surface of the active layer can serve as part of the path for current flow between the main electrodes and hence the (channel width)/(channel length) ratio of the channel of the thin film transistor can be increased equivalently. This leads to an increased on-current of the thin film transistor. Accordingly, in an active matrix circuit board utilizing the thin film transistor structure of the present invention, many faults in characteristics of thin film transistors associated with individual display segments can be eliminated to achieve high production yield. Also, an image display device comprised of the active matrix circuit board can take advantage of the features of the thin film transistors and active matrix circuit board constituted by these transistors to improve response characteristics and eliminate unevenness in displayed images.

BRIEF DESCRIPTION OF THE DRAWINGS

FIGS. 1A to 1D and FIGS. 2 and 3 are sectional views illustrating prior art thin film transistor structures.

DESCRIPTION OF THE PREFERRED EMBODIMENTS

Figure 4A:
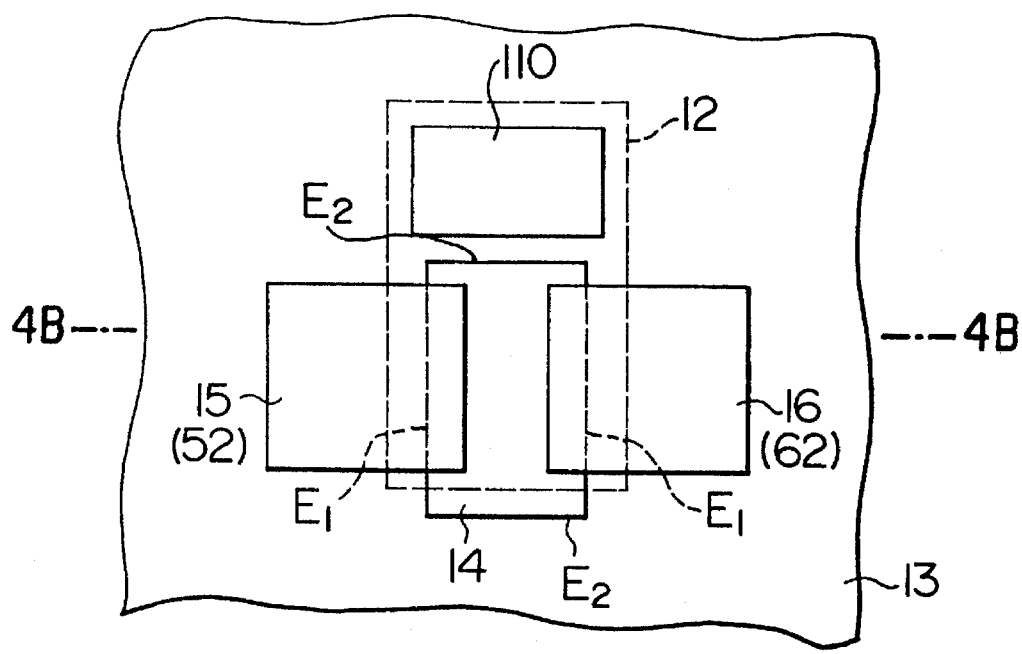
FIG. 4A is a plan view illustrating a thin film transistor structure according to a first embodiment of the present invention.
Figure 4B:
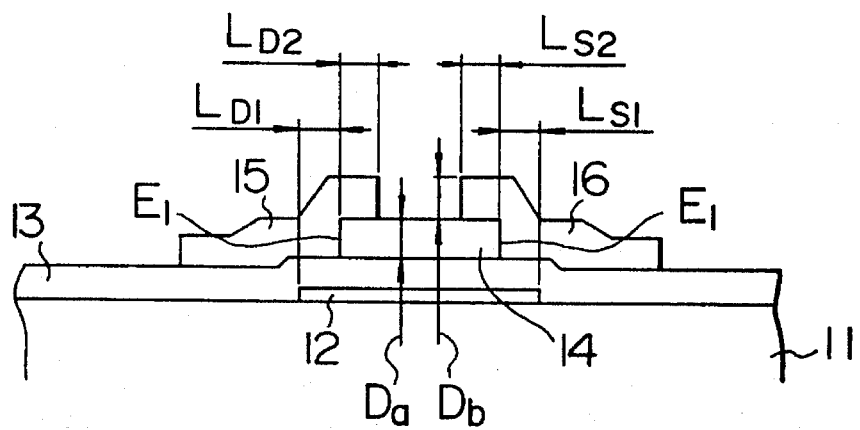
FIG. 4B is a sectional view taken on the line IVB—IVB of FIG. 4A.

Referring now to FIGS. 4A, 4B and FIGS. 5 to 7, a thin film transistor structure according to a first embodiment of the invention will be described. As shown in FIGS. 4A and 4B, the transistor structure has an insulating base plate 11 formed of, for example, a glass plate, a control electrode (gate electrode) 12 comprised of a metal layer of, for example, chromium (Cr) formed on the base plate 11, a gate insulating layer 13 in the form of an insulating layer of, for example, silicon nitride which is formed on the control electrode 12 and on the base plate 11, an active layer 14 such as an a-Si (amorphous silicon) layer formed on a part of insulating layer 13 which is on the control electrode layer 12, and first and second main electrode layers (drain and source electrode layers) 15 and 16 comprised of metal layers of, for example, aluminum (Al) which are so formed on the active layer 14 so as to be spaced from each other.

The main electrodes 15 and 16 define, in cooperation with the control electrode 12, a channel in the active layer 14 between the electrodes 15 and 16. As best seen in FIG. 4A, the active layer 14 has, at either lateral side in the drawing, a first peripheral edge portion $E_1$ generally perpendicular to the direction of the channel and, at either vertical side in the drawing, a second peripheral edge portion $E_2$ generally not perpendicular to the direction of the channel. Each of the electrodes 15 and 16 (or alternately any one of the two electrodes) extends over the first peripheral edge portion $E_1$ of the active layer 14 onto the insulating layer 13 such that at least a part of the first peripheral edge portion $E_1$ has its side surface directly covered with the electrode 15 or 16 and a part of the electrode 15 or 16 overlaps the control electrode 12 only with the insulating layer 13 lying therebetween.

In FIGS. 4A and 4B, the electrodes 15, 16 extend over the underlying control electrode 12. However, that is not always necessary as far as they directly cover the edge portion $E_1$. Da denotes a thickness of the a-Si active layer and DB denotes a thickness of the Al layer constituting each of the first and second main electrodes. The first main electrode overlaps the control electrode by an amount of $L_{D1}$ and both the control electrode and active layer by an amount of $L_{D2}$, and the second main electrode overlaps the control electrode by an amount of $L_{S1}$ and both the control electrode and active layer by an amount of $L_{S2}$. The amounts $L_{D1}$ and $L_{S1}$ satisfy the following relation:

$$L_{D1} \geq Da \text{ and/or } L_{S1} \geq Da.$$

In addition, it is preferable that the following relation be satisfied for $L_{D2}$ and $L_{S2}$, but the satisfaction of this relation is not indispensable:

$$L_{D2} \geq Db \text{ and/or } L_{S2} \geq Db.$$

The thin film transistor structure of this embodiment may be manufactured through process steps outlined below.

(1) A metal layer of, for example, Cr is first formed, through a sputtering process or another deposition process, on a glass plate 11 cleaned by washing.
(2) A gate electrode pattern 12 is formed through an ordinary photoetching process.
(3) A silicon nitride layer 13 and an a-Si layer are formed successively through plasma CVD (chemical vapor deposition) process or another deposition process by using a mixture gas of silane, ammonia and nitrogen for the silicon nitride layer 13 and a mixture gas of silane and hydrogen for the a-Si layer.
(4) A pattern 14 of the a-Si layer is formed through ordinary photolithography process and by dry etching.
(5) A metal layer of, for example, Al is formed by sputtering.
(6) A drain electrode pattern 15 and a source electrode pattern 16 are formed through ordinary photoetching process.
(7) Gate terminals are exposed through ordinary photolithography process and by dry etching.

Through the above process steps, an a-Si TFT shown in FIGS. 4A and 4B can be completed.

Figure 5:
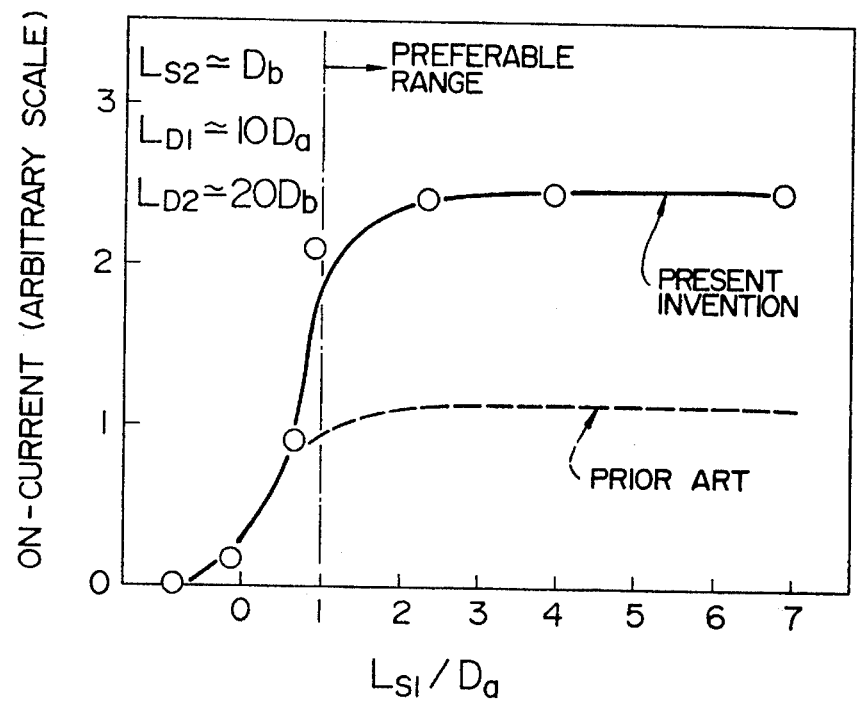
FIGS. 5 and 6 are graphs useful for explaining the principle and effect of the present invention.

Effect of this embodiment is graphically shown in FIG. 5. The influence of the electrode overlap upon the on-current is greater at the source/gate than at the drain/gate and therefore the relation between $L_{S1}$ of the source electrode and on-current is graphically shown in FIG. 5 on condition that $L_{D1}$ of the drain electrode, representative of the amount of overlap between the drain and gate electrodes, is sufficiently large to provide a sufficient decrease in resistance at the drain electrode. As the $L_{S1}$ increases, the on-current increases abruptly and saturates within a range of $L_{S1} \geq Da$, indicating that the range of $L_{S1} \geq Da$ is allowed for extraction of drain current. Results obtained with the prior art a-Si TFT of FIG. 1B are also shown graphically in FIG. 5. Since, in the prior art TFT, $L_{S1} < 0$ stands indicating that the a-Si layer 14(4) extends beyond the gate electrode 12(2), the source electrode always overlaps the gate electrode through not only the insulating layer but also the a-Si layer. Data for the prior art a-Si TFT is obtained under such an electrode overlap relation. As the overlap amount increases beyond about 1.5 Da, on-current of the prior art TFT saturates but the saturation level is about half the saturation level of the a-Si TFT of the present embodiment.

Figure 6:
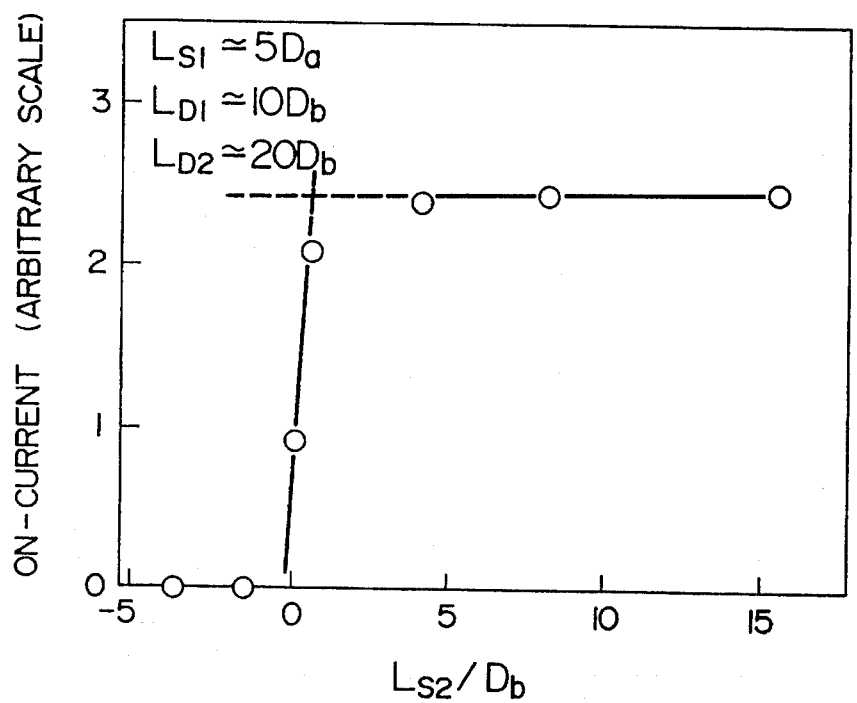

FIG. 6 graphically illustrates the relation between on-current and the amount $L_{S2}$ by which the source electrode overlaps the gate electrode with a laminated layer of (gate insulating layer 13+a-Si layer 14) interposed therebetween. For $L_{S2} < 0$, the source electrode does not contact the channel and as a result no on-current flows. As the $L_{S2}$ increases to approximately the thickness of the thin layer constituting the source electrode, on-current begins to flow. This is because the source electrode 16 comes into contact with the a-Si layer 14.

Figure 7:
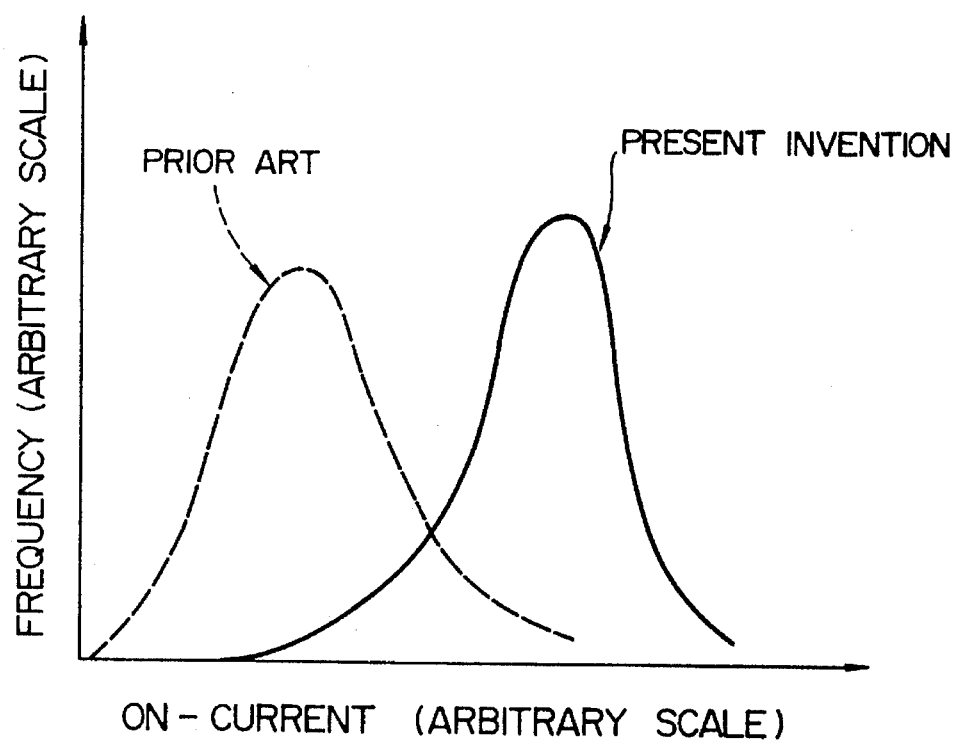
FIG. 7 is a graph useful for explaining beneficial effects of the present invention.

When about 500 a-Si TFT's of the present invention are formed on a base plate of 100×100 mm$^2$ and on-currents of individual TFT's are measured, a distribution of on-currents as shown at solid curve in FIG. 7 can be obtained. In comparison with an on-current distribution obtained with the prior art TFT's, shown at dotted curve in FIG. 7, the peak of the present distribution according to the invention occurs for larger on-currents and the width of distribution is narrower.

Starting from the prior art structure shown in FIG. 1B, the aforementioned beneficial effect of the present embodiment can be obtained by partly removing the a-Si layer interposed between the gate electrode and each of the source and drain electrodes, replacing a removed part of the a-Si layer with the thin layer constituting each of the source and drain electrodes, and bringing each electrode layer into complete contact with the a-Si layer. Practically, to meet the requirements $L_{S1} \geq Da$ and $L_{S2} \geq Db$, various factors are, including the thickness Da typically amounting to 10 to 300 nm, Db typically amounting to 300 nm to 1 μm, accuracy of registration in photoetching process and capacitance between the source and gate electrodes and most preferably, for the source electrode, $L_{S1}$ measures 1 to 3 μm and $L_{S2}$ measures 1 to 3 μm. When applying the a-Si TFT's to an active matrix circuit board, the first and second main electrodes shown in FIGS. 4A and 4B act as source electrode and drain electrode, respectively, and in this embodiment structural dimensions of the first main electrode serving as drain electrode are also determined similarly. Accordingly, $L_{D1}$ practically measures 1 to 3 μm and $L_{D2}$ practically measures 1 to 3 μm.

Figure 8:
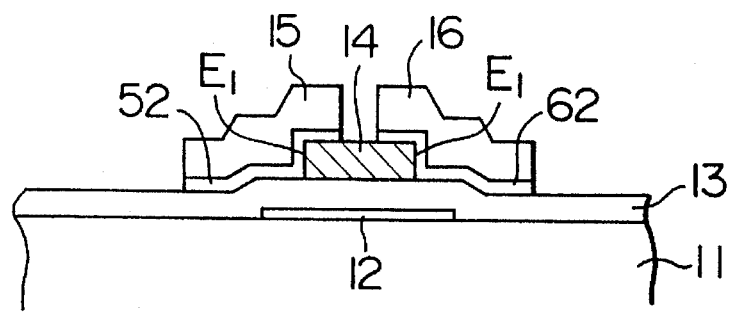
FIG. 8 is a sectional view illustrating a thin film transistor structure according to a second embodiment of the present invention.

FIG. 8 shows a TFT structure according to a second embodiment of the present invention. In this embodiment, $n^+$-type a-Si layers 52 and 62, doped with impurities such as phosphor (P), arsenic (As) or antimony (Sb), underlie the first and second main electrode layers 15 and 16, respectively. In comparison with the first embodiment, this second embodiment is effective to slightly increase the on-current and improve heat-proof capability and can attain effect comparable and superior to that by the first embodiment. A plan view of FIG. 8 is identical to FIG. 4A.

Figure 9A:
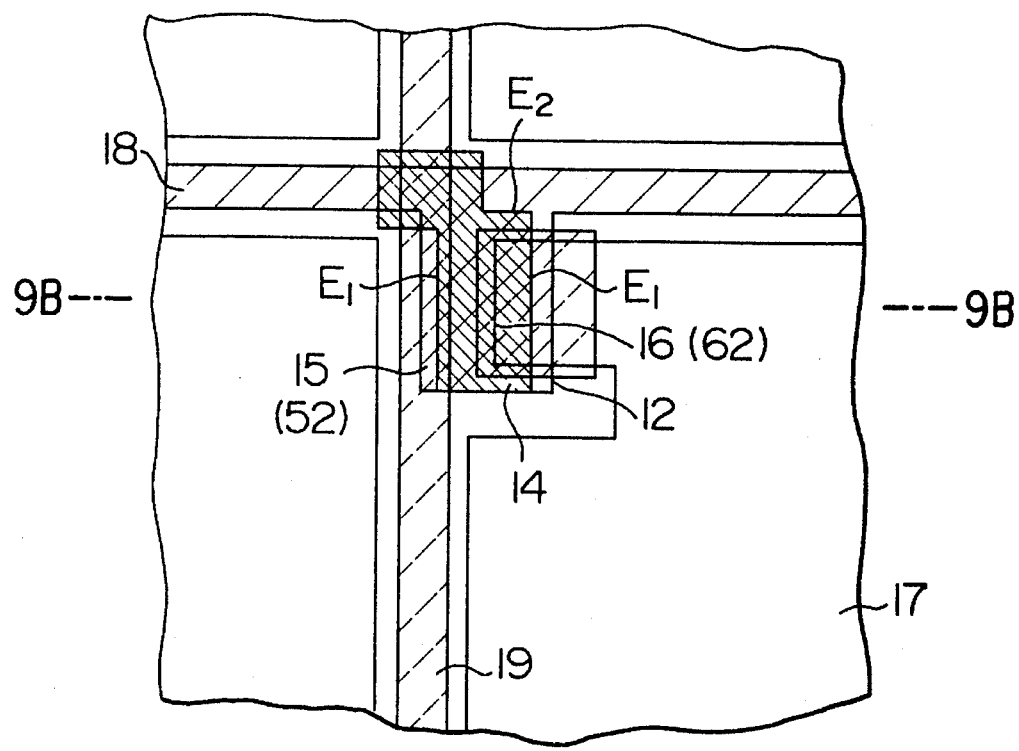
FIG. 9A is a fragmentary plan view showing an active matrix circuit board according to a third embodiment of the present invention.
Figure 9B:
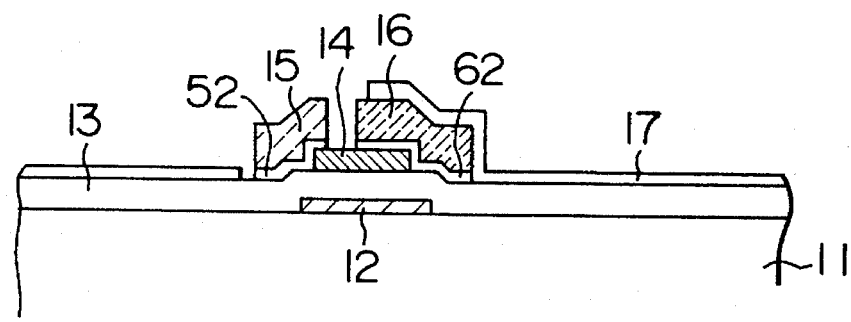
FIG. 9B is a sectional view taken on the line IXB—IXB of FIG. 9A.

Turning to FIGS. 9A and 9B, there is illustrated an active matrix circuit board according to a third embodiment of the present invention. In particular, the active matrix circuit board utilizing the a-Si TFT structure shown in FIG. 8 is partly illustrated, in plan view form, in FIG. 9A and in sectional view form taken on the line IXB—IXB in FIG. 9B. As described previously, the a-Si layer is partly removed under the drain electrode 15 and source electrode 16 to make room for these electrodes. Each of the main electrodes 15 and 16 is shaped and it overlaps the electrode 12 as described previously in connection with FIGS. 4A and 4B. The drain electrode 15 is connected to a signal line (drain bus line) 19 and the gate electrode 12 to a scanning line (gate bus line) 18. The source electrode 16 is connected to a display segment electrode 17. This active matrix circuit board utilizes the a-Si TFT structure shown in FIG. 8 and can attain the previously-described effect including reduction of unevenness in displayed images and improvement of response characteristics. The manufacturing process for the active matrix circuit board almost resembles that of the a-Si TFT's shown in FIGS. 4A, 4B and FIG. 8 and will be described below in brief.

(1) A metal layer of, for example, Cr is formed on a cleaned glass base plate 11 through, for example, a sputtering process and patterned into a gate electrode pattern 12 and gate bus lines 18 through an ordinary photoetching process.

(2) A silicon nitride layer serving as gate insulating layer 13 and an a-Si layer serving as semiconductor active layer 14 are formed successively, without disturbing vacuum atmosphere, through plasma CVD process by using a mixture gas of silane, ammonia and nitrogen for the silicon nitride layer and a mixture gas of silane and hydrogen for the a-Si layer.

(3) The a-Si layer is worked through an ordinary photolithography process and by dry etching to form a predetermined a-Si pattern 14. In this process step, technical teachings of the present invention are applied.

(4) An n⁺-type a-Si layer is formed on the a-Si layer 14 and insulating layer 13 through plasma CVD process by using a mixture gas of silane, hydrogen and phosphine.

(5) A Cr layer and an Al layer are sequentially laminated through, for example, sputtering process to form source and drain electrodes 16, 15 and drain bus line 19. Subsequently, a part of the n⁺-type a-Si layer which is above the channel is removed by dry etching.

(6) An ITO (indium tin oxide) layer serving as transparent conductive layer is formed through sputtering process. Subsequently, the transparent conductive layer is patterned into a display segment electrode pattern 17 through an ordinary photoetching process.

(7) The silicon nitride layer serving as gate insulating layer is, patterned through ordinary photolithography process and by dry etching for provision of terminals of the gate bus lines 18.

Through the above process steps, an active matrix circuit board shown in FIG. 9A can be completed.

In the previous embodiments chromium (Cr) is used for the gate electrode 12 and gate bus line 18, a multi-layer structure of Cr and Al is used as the drain electrode 15, source electrode 16 and drain bus line 19, and a silicon nitride layer is used as the gate insulating layer 13. However, a material other than Cr (for example, molybdenum, tantalum, ITO or aluminum) may also be used for the gate electrode 12 and gate bus line 18, a layer other than the multi-layer structure of Cr and Al (for example, a single layer of Cr or Al, or a layer made of ITO, molybdenum or tantalum) may also be used as the drain electrode 15, source electrode 16 and drain bus line 19, and a layer other than the silicon nitride layer (for example, silicon oxide layer or tantalum oxide layer) may also be used as the gate insulating layer 13.

Figure 10A:
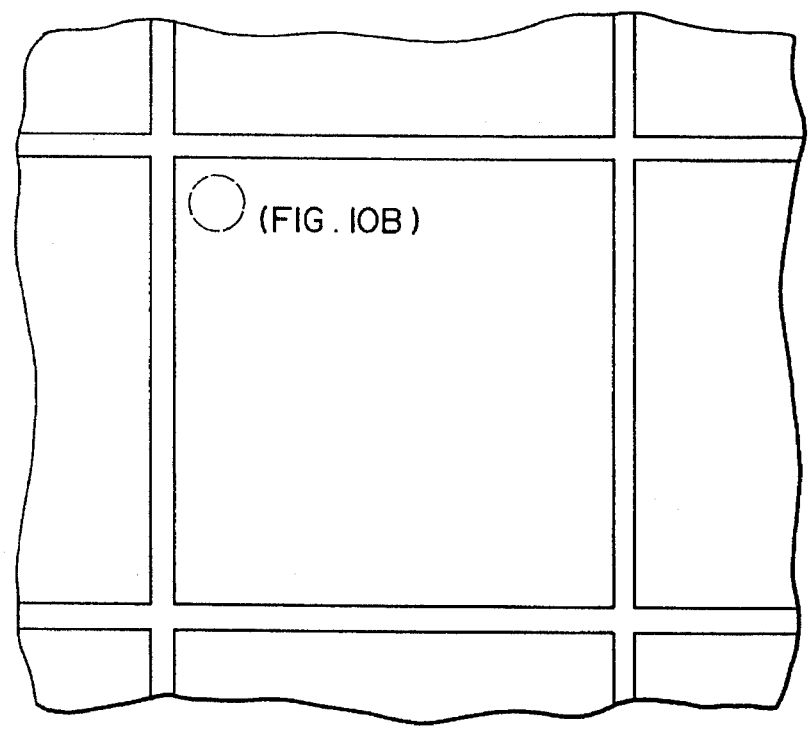
FIG. 10A is a fragmentary plan view showing an image display device according to a fourth embodiment of the present invention.
Figure 10B:
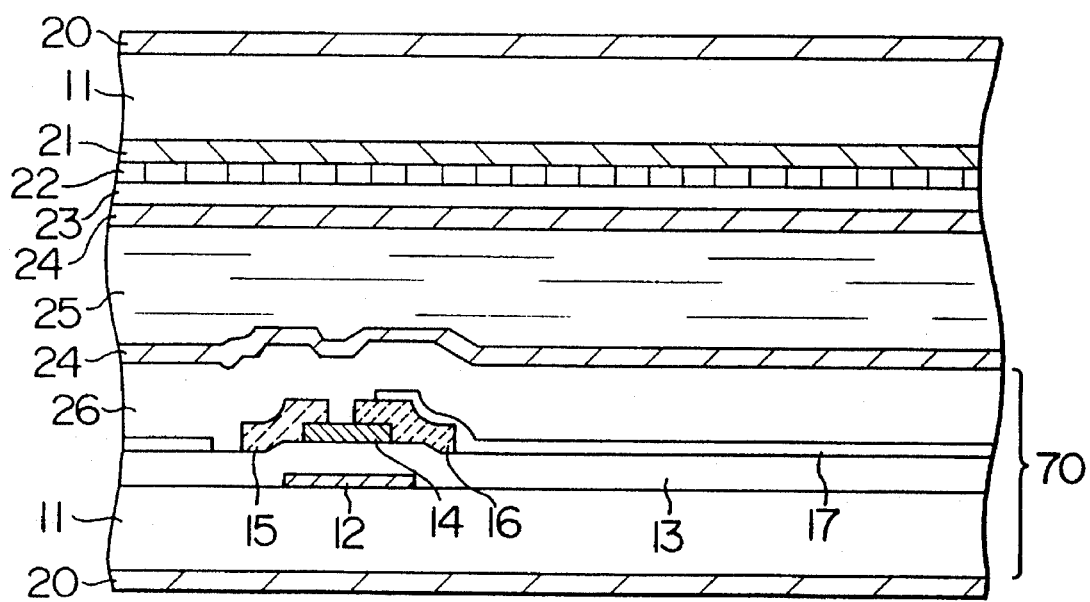
FIG. 10B is a sectional view of FIG. 10A.

Turning to FIGS. 10A and 10B, an image display device according a fourth embodiment of the present invention will be described. The image display device is a liquid crystal display device using an active matrix circuit board including a-Si TFT structures shown in FIGS. 4A and 4B. In particular, the essential part of the image display device is illustrated, in schematic plan view form, in FIG. 10A and in sectional view form in FIG. 10B.

In FIG. 10B, 70 designates the active matrix circuit board including a-Si TFT structures of FIGS. 4A and 4B in accordance with the first embodiment of the invention, 20 a polarizer plate, 21 a color filter, 23 an electrode opposed to the display segment electrode 17 in the form of a transparent conductive layer and like the electrode 17 formed of a transparent conductive layer, 22 and 26 protective layers, 24 an orientation layer, and 25 liquid crystal material filled in a gap.

In this embodiment, the image display device is constructed as above and used for color display. This image display device can be manufactured easily through manufacture steps similar to those for wellknown color liquid crystal display devices.

Practically, the display device comprises, in addition to the components shown in FIGS. 10A and 10B, image display driving means including a control system for various electric circuits and back illumination means but the image display driving means is well known and will not be described herein.

Referring to FIGS. 11, 12, 13A and 13B, an a-Si TFT structure according to a fifth embodiment of the present invention will now be described. In particular, the transistor structure is shown in sectional view form in FIG. 11 and has an insulating base plate 11 such as a glass plate, a control electrode (gate electrode) 12 comprised of a metal layer of, for example, chromium (Cr), a first insulating layer (gate insulating layer) 13 such as a silicon nitride layer, an a-Si layer 14, a first main electrode (drain electrode) 15 comprised of a metal layer of, for example, aluminum (Al), a second main electrode (source electrode) 16 comprised of a metal layer of, for example, Al and a second insulating layer (protective layer) 100 such as a silicon nitride layer. The first main electrode (e.g. drain electrode) overlaps the control electrode (gate electrode) by an amount of $L_{D1}$ and both the control electrode and a-Si layer by an amount of $L_{D3}$, and the second main electrode (e.g., source electrode) overlaps the control electrode by an amount of $L_{S1}$ and both the control electrode and a-Si layer by an amount of $L_{S3}$. The degree of extension of the electrodes 15 and 16 on the insulating layer 13 may be similar to that described in connection with the structure shown in FIGS. 4A and 4B. The a-Si layer has a thickness of Da, the thin layer constituting the first main electrode has a thickness of $D_{b1}$ and the thin layer constituting the second main electrode has a thickness of $D_{b2}$. The overlap amounts $L_{D1}$ and $L_{S1}$ corresponding to those shown in FIGS. 4A and 4B and the overlap amounts $L_{D3}$ and $L_{S3}$ satisfy the following relations:

$$L_{D1} \geq Da \text{ and/or } L_{S1} \geq Da,$$

$$L_{D3} \geq D_{b1} \text{ and/or } L_{S3} \geq D_{b2}.$$

The TFT structure of this embodiment may be manufactured through process steps outlined below.

(1) Firstly, a metal layer of, for example, Cr is formed through, for example, a sputtering process on a glass base plate 11 cleaned by washing.

(2) A control electrode (gate electrode) pattern 12 is formed through an ordinary photoetching process.

(3) A silicon nitride layer serving as first insulating layer (gate insulating layer) 13, a semiconductor layer serving as a-Si layer 14 and a silicon nitride layer serving as second insulating layer 100 are formed successively through plasma CVD process by using a mixture gas of silane, ammonia and nitrogen for the first insulating layer 13, a mixture gas of silane and hydrogen for the a-Si layer 14 and a mixture gas of silane, ammonia and nitrogen for the second insulating layer 100.

(4) The silicon nitride layer serving as second insulating layer and the a-Si layer are worked through an ordinary photolithography process and by dry etching to settle the aforementioned relations.

(5) A metal layer of, for example, Al is formed through, for example, a sputtering process.

(6) A first main electrode (drain electrode) pattern 15 and a second main electrode (source electrode) pattern 16 are formed through ordinary photoetching process.

(7) Gate electrode terminals are exposed through ordinary photolithography process and by dry etching.

Figure 11:
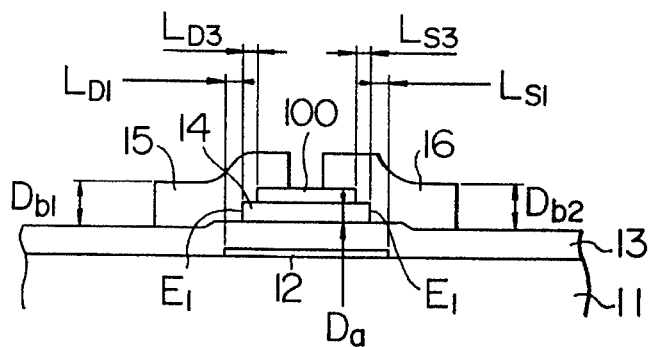
FIG. 11 is a sectional view showing a silicon thin film transistor structure according to a fifth embodiment of the present invention.

Through the above process steps, an a-Si TFT structure shown in FIG. 11 is completed.

Figure 12:
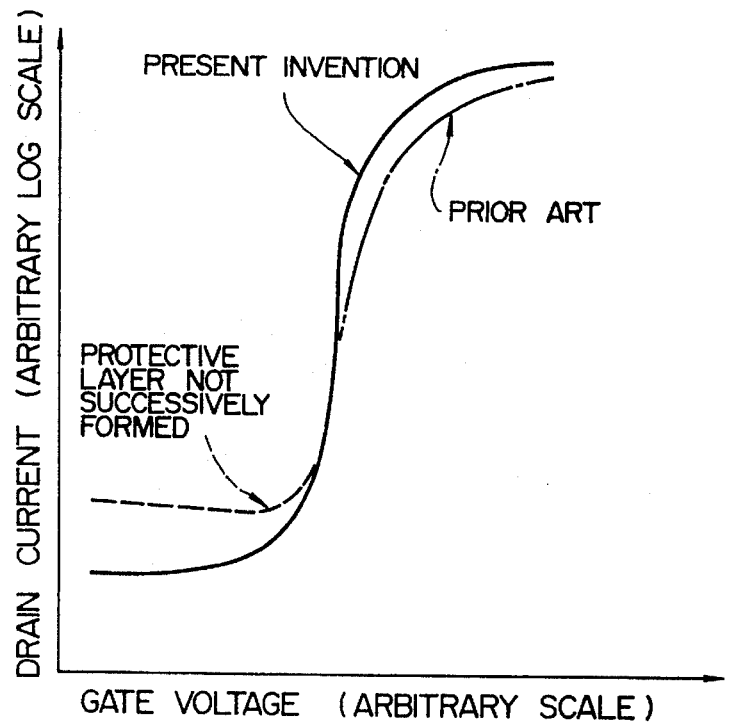
FIGS. 12, 13A and 13B are graphs useful in explaining beneficial effect of the embodiment illustrated in FIG.

FIG. 12 graphically shows a drain current/gate voltage characteristic of the a-Si TFT in accordance with this embodiment, along with data for the prior art a-Si TFT structure shown in FIG. 3. On-current tends to be lower in the prior art TFT structure than in the TFT structure of this embodiment. Experimental data showed a decreased on-current in the prior art TFT structure which amounted to about 60% of on-current in the TFT structure of the present embodiment.

Figure 13A:
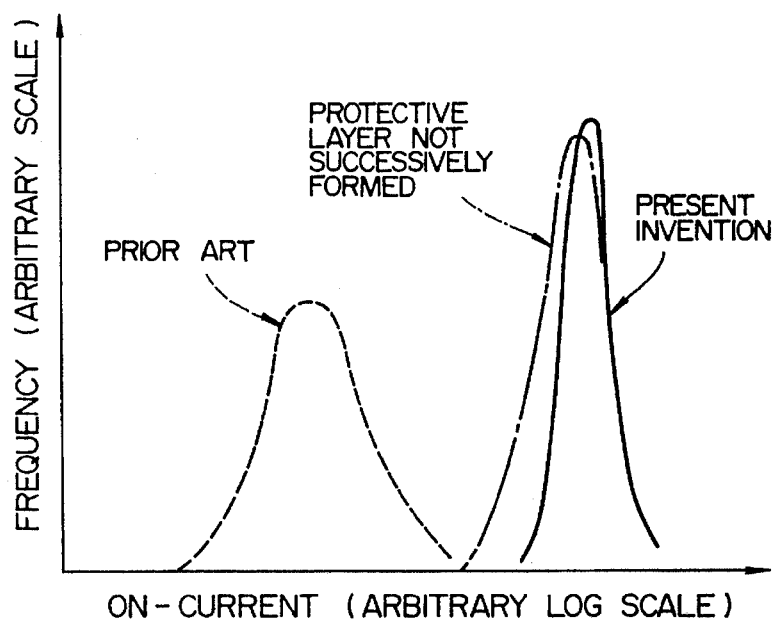
Figure 13B:
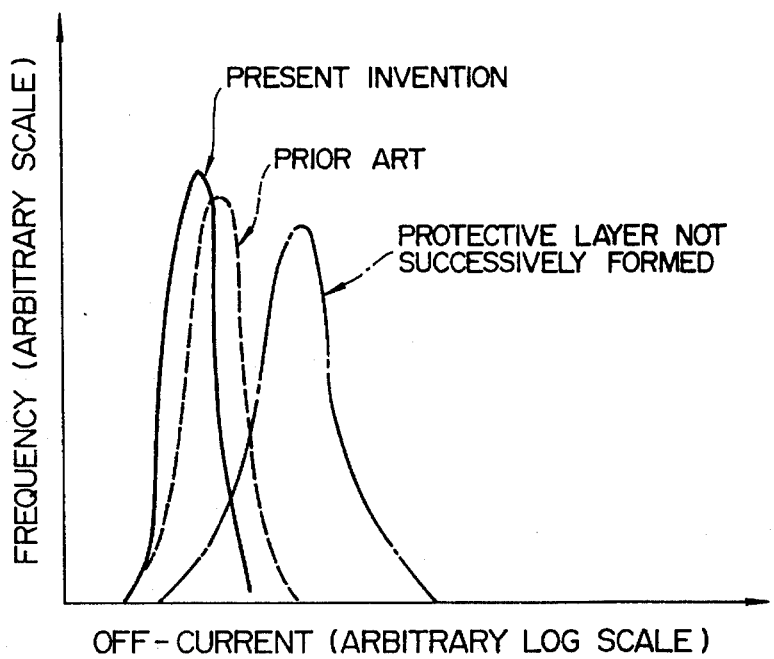

On-currents and off-currents of a-Si TFT's are measured to obtain on-current distributions (reproducibility) as shown in FIG. 13A and off-current distributions (reproducibility) as shown in FIG. 13B. These figures clearly demonstrate that the TFT structure of the present embodiment is superior to the prior art TFT structure in point of characteristics (magnitude of on-current and off-current) and reproducibility.

The aforementioned beneficial effect of the present embodiment can be obtained by successively forming the a-Si layer 14 and the second insulating layer 100, partly removing the a-Si layer interposed between the gate electrode and each of the first and second main electrodes to an extent equalling and/or exceeding the thickness of the a-Si layer in order to replace a removed part of the a-Si layer with the thin layer constituting each of the first and second main electrodes, and bringing each of the first and second main electrodes into complete contact with the a-Si layer. Practically, to meet the requirements $L_{S1} \geq Da$ and $L_{D1} \geq Da$ and $L_{S3} \geq D_{b2}$ and $L_{D3} \geq D_{b1}$, various factors are considered including the thickness Da typically amounting to 10 to 300 nm, the thicknesses $D_{b1}$ and $D_{b2}$ typically amounting to 300 nm to 1 µm, accuracy of registration in photoetching process and capacitance between the electrodes and most preferably, each of the overlap amounts $L_{S1}$ and $L_{D1}$ measures 1 to 3 µm and each of the overlap amounts $L_{D3}$ and $L_{S3}$ measures 1 to 3 µm.

Figure 14:
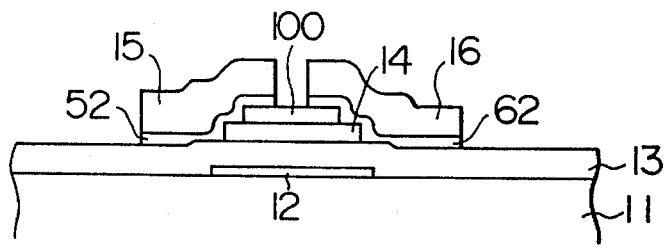
FIG. 14 is a sectional view showing a silicon thin film transistor structure according to a sixth embodiment of the present invention.

FIG. 14 shows an a-Si TFT structure according to a sixth embodiment of the present invention. This embodiment is essentially the same as the FIG. 11 embodiment with the only exception that n$^+$-type a-Si layers 52 and 62 doped with impurities such as phosphorus (P), arsenic (As) or antimony (Sb) underlie the first and second main electrodes. In comparison with the fifth embodiment, this sixth embodiment is effective to slightly increase the on-current and improve heat-proof capability and can attain effects comparable and superior to that by the fifth embodiment.

Figure 15A:
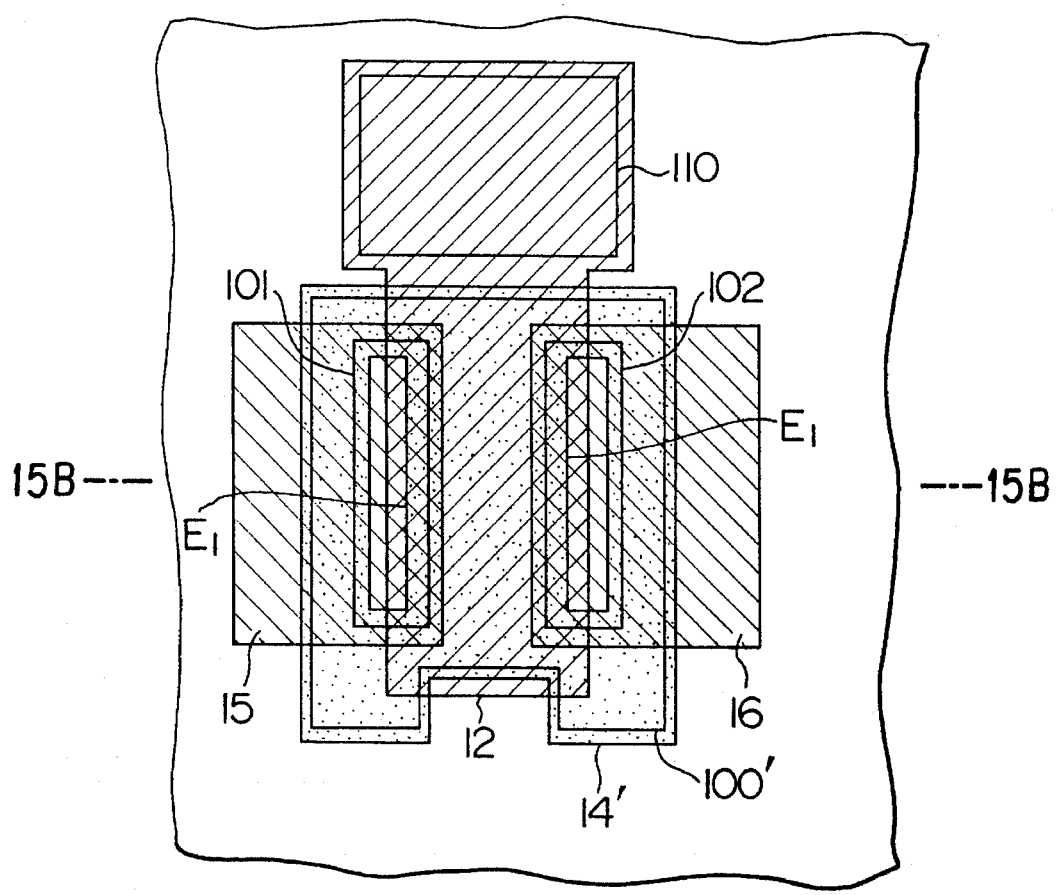
FIGS. 15A and 15B are diagrams illustrating a thin film transistor structure according to a seventh embodiment of the present invention.
Figure 15B:
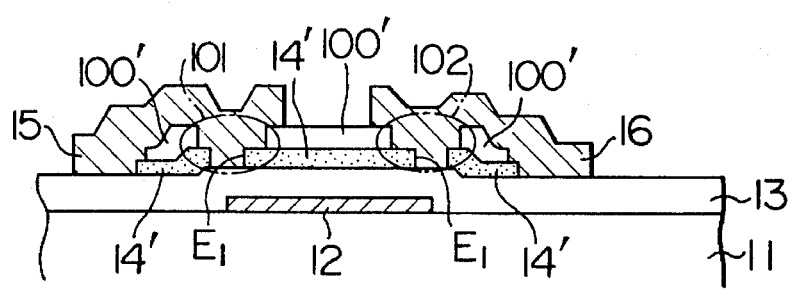

FIGS. 15A and 15B show an a-Si TFT structure according to a seventh embodiment of the present invention. In this embodiment, each of the first and second main electrodes 15 and 16 extends into a through-hole 101 or 102 formed in a second insulating layer 100' and an a-Si layer 14' so as to connect to the a-Si layer 14'. To provide the contact connection, each of the main electrodes 15 and 16 is shaped and it overlaps the electrode 12 as described previously in connection with FIG. 11. The seventh embodiment is essentially the same as the fifth embodiment and can attain substantially the same effect as the fifth embodiment.

Figure 16A:
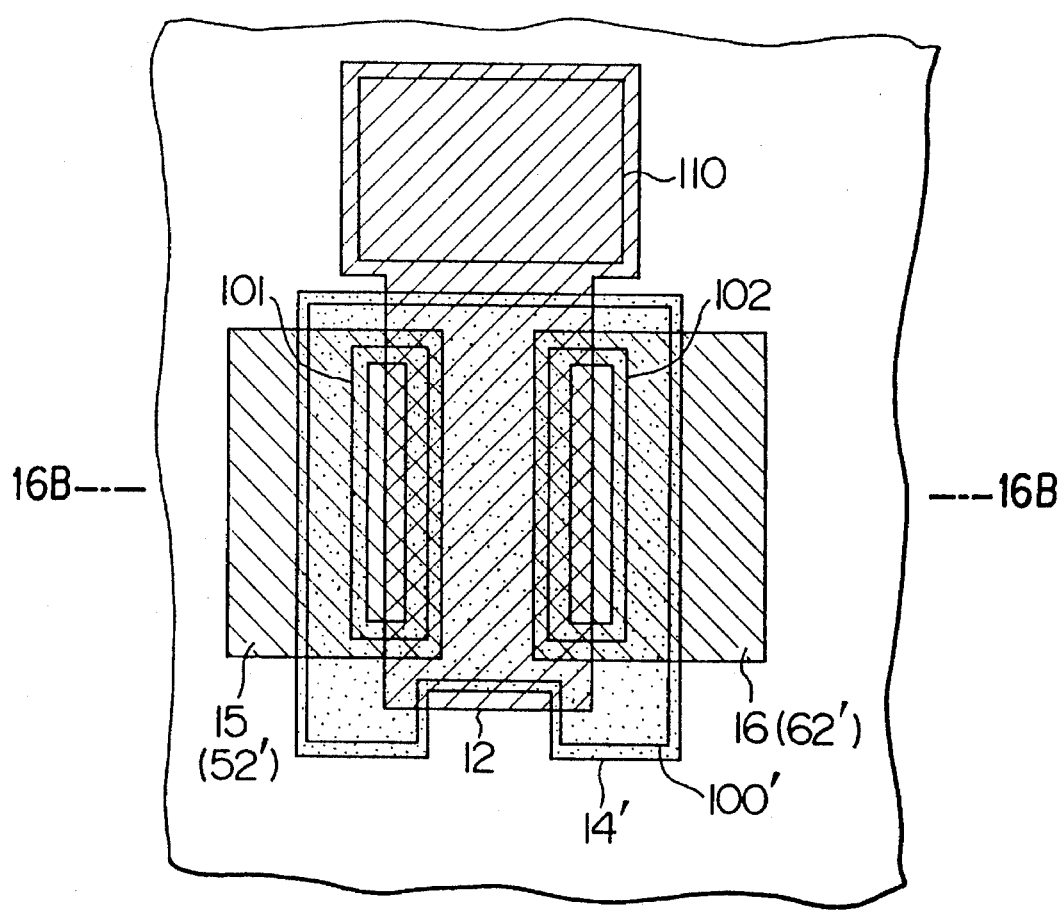
FIGS. 16A and 16B are diagrams illustrating a thin film transistor structure according to an eighth embodiment of the present invention.
Figure 16B:
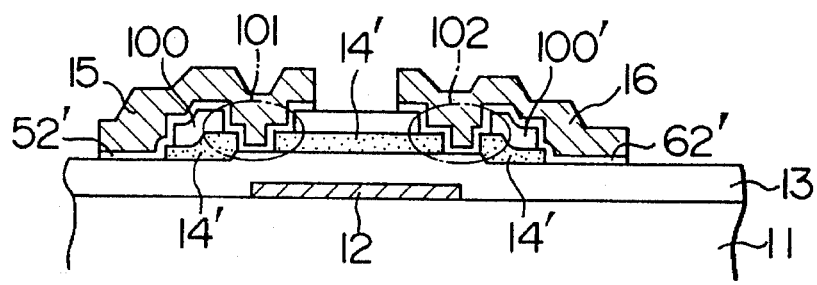

FIGS. 16A and 16B show an a-Si TFT structure according to an eighth embodiment of the present invention. This embodiment is essentially the same as the seventh embodiment with the only exception that n$^+$-type a-Si layers 52' and 62' doped with impurities such as phosphorus (P), arsenic (As) or antimony (Sb) underlie the first and second main electrodes 15 and 16. In comparison with the seventh embodiment, this eighth embodiment is effective to slightly increase the on-current and improve heat-proof capability and can attain effects comparable and superior to that by the seventh embodiment.

Figure 17A:
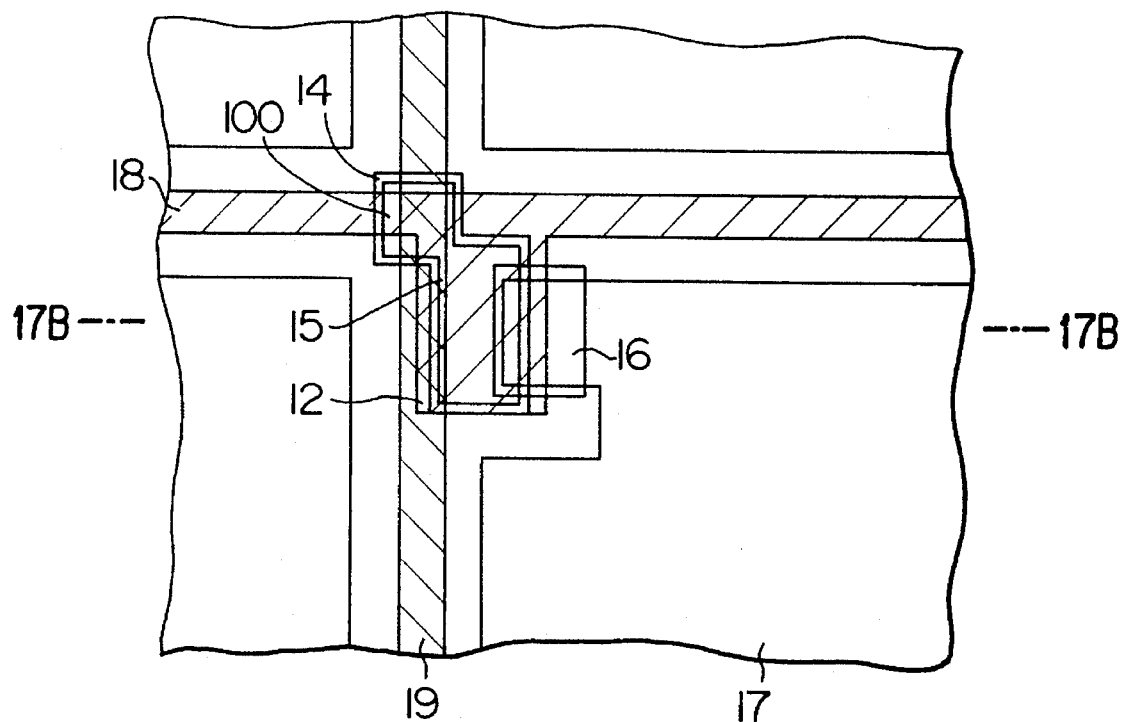
FIGS. 17A and 17B are fragmentary plan view and sectional view of an active matrix circuit board according to a ninth embodiment of the present invention.
Figure 17B:
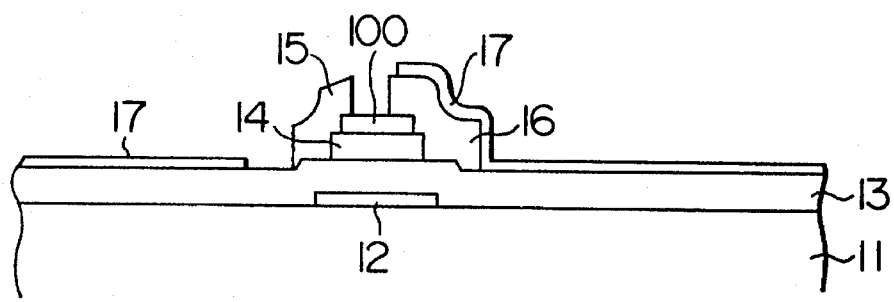

Turning to FIGS. 17A and 17B, there is illustrated an active matrix circuit board according to a ninth embodiment of the present invention. In particular, FIG. 17A is a fragmentary plan view showing the active matrix circuit board utilizing the a-Si TFT structure of the invention, and FIG. 17B is a sectional view taken on the line XVIIB—XVIIB of FIG. 17A to show the lamination structure of the TFT structure. The a-Si layer is partly removed under the drain electrode 15 and source electrode 16 to make room for these electrodes and the second insulating layer 100 lies inside the a-Si layer 14, thus forming the contact connection regions to which technical teachings of the invention are applied. The drain electrode 15 is connected to a signal line (drain bus line) 19 and the gate electrode 12 to a scanning line (gate bus line) 18. The source electrode 16 is connected to a display segment electrode 17. This active matrix circuit board utilizes the a-Si TFT structure shown in FIG. 11 and can attain the previously described effect including improvement of characteristic distribution and response characteristic. The manufacturing process for the active matrix circuit board almost resembles that of the a-Si TFT structure shown in FIG. 11 and will be described below in brief.

(1) A metal layer of, for example Cr is formed on a cleaned glass substrate 11 through, for example, a sputtering process and patterned into a gate electrode pattern 12 and gate bus lines 18 through an ordinary photoetching process.

(2) A silicon nitride layer serving as gate insulating layer 13, an a-Si layer serving as semiconductor layer 14 and a silicon nitride layer serving as second insulating layer 100 are formed successively, without disturbing vacuum atmosphere, through plasma CVD process by using a mixture gas of silane, ammonia and nitrogen for the gate insulating layer 13, a mixture gas of silane and hydrogen for the semiconductor layer 14 and a mixture gas of silane, ammonia and nitrogen for the second insulating layer 100.

(3) The a-Si layer and silicon nitride layer are worked through an ordinary photolithography process and by dry etching to form predetermined a-Si pattern 14 and second insulating layer pattern 100. In this process step, technical teachings of the invention described in connection with FIG. 11 are applied.

(4) A Cr layer and an Al layer are sequentially laminated through, for example, sputtering process to form source and drain electrodes 16, 15 and drain bus line 19.

(5) An ITO (indium tin oxide) layer serving as transparent conductive layer is formed through sputtering process. Subsequently, the transparent conductive layer is patterned into a display segment electrode pattern 17 through an ordinary photoetching process.

(6) The silicon nitride layer serving as gate insulating layer is patterned through an ordinary photolithography process and by dry etching for provision of terminals of the gate bus lines 18.

Through the above process steps, an active matrix circuit board shown in FIG. 17A can be completed.

In the previous embodiments, chromium (Cr) is used for the gate electrode 12 and gate bus line 18, a multi-layer structure of Cr and Al is used as the drain electrode 15, source electrode 16 and drain bus line 19, and silicon nitride layers are used as the gate insulating layer and second insulating layer. However, a material other than Cr (for example, molybdenum, tantalum, ITO or aluminum) may also be used for the gate electrode 12 and gate bus line 18, a layer other than the multi-layer structure of Cr and Al (for example, a single layer of Cr or Al, or a layer made of ITO, molybdenum or tantalum) may also be used as the drain electrode 15, source electrode 16 and drain bus line 19, and a layer other than the silicon nitride layer (for example, silicon oxide layer or tantalum oxide layer) may also be used as the gate insulating layer 13 and second insulating layer 100.

Figure 18:
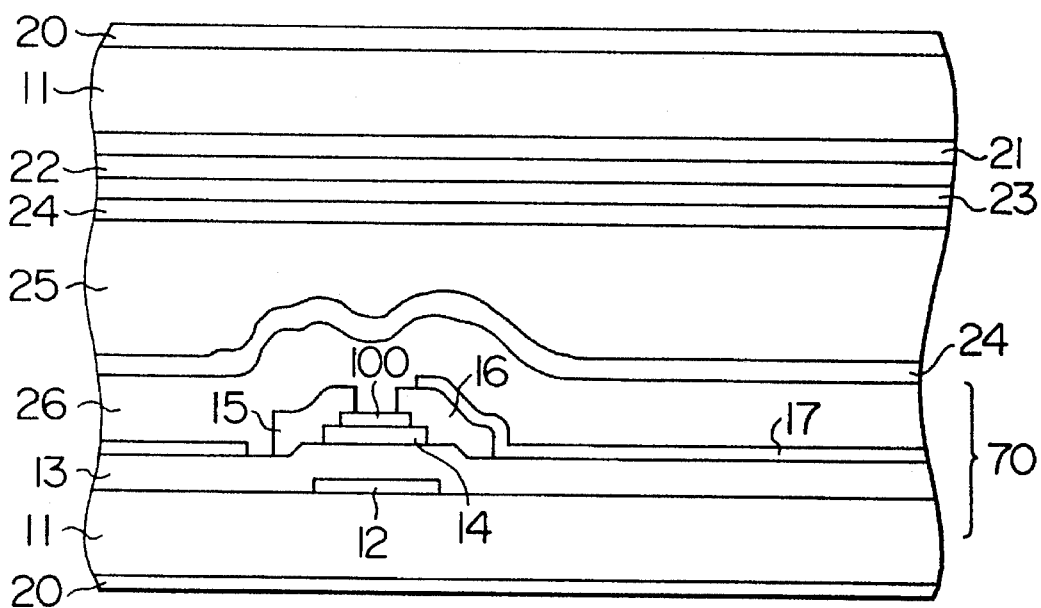
FIG. 18 is a fragmentary sectional view of an image display device according to a tenth embodiment of the present invention.

FIG. 18 shows an essential part of an image display device according to a tenth embodiment of the present invention. The image display device is a liquid crystal display device using an active matrix circuit board including a-Si TFT's shown in FIG. 11.

Referring to FIG. 18, 70 designates the active matrix circuit board including a-Si TFT structures of FIG. 11 in accordance with the fifth embodiment of the invention, 20 a polarizer plate, 21 a color filter, 23 an electrode opposed to the display segment electrode 17 in the form of a transparent conductive layer and like the electrode 17 formed of a transparent conductive layer, 22 and 26 protective layers, 24 an orientation layer, and 25 liquid crystal material filled in a gap.

In this embodiment, the image display device is constructed as above and used for color display. This image display device can be manufactured easily through manufacturing steps similar to those for wellknown color liquid crystal display devices.

Practically, the display device comprises, in addition to the components shown in FIG. 18, image display driving means including a control system for various electric circuits and back illumination means but the image display driving means per se are well known and will not be described herein.

As described above, in accordance with the fifth to tenth embodiments, the on-current/off-current ratio of the a-Si TFT structure can advantageously be increased and its reproducibility can be improved.

Accordingly, in an active matrix circuit board including the a-Si TFT structures, the on-characteristic distribution over the a-Si TFT structures associated with individual display segments can be uniform and high production yield can be realized to advantage. Further, thanks to the aforementioned advantages of the a-Si TFT structure and the active matrix circuit board including the a-Si TFT structures, an image display device utilizing the active matrix circuit board can improve response characteristics and eliminate unevenness in displayed images to advantage.

Generally, in the a-Si TFT structure as described in connection with the foregoing embodiments, the drain current greatly depends on the size of the active layer, i.e., the a-Si layer pattern, especially, the length in the direction of the channel. More particularly, to obtain an increased on-current in the TFT structure, the a-Si layer must be so patterned as to have a short channel length. However, in an application where the TFT structure is used as a switching element in an active matrix circuit board of an image display device, warps in the board and a large area of the board impose restraints on the photoetching process and reduction in size of the a-Si layer pattern is sometimes limited, with the result that even in a TFT structure having high mobility, there is a possibility that attainment of such a high on-current is not expected. An embodiment directed to improvements in this respect will now be described.

Figure 19A:
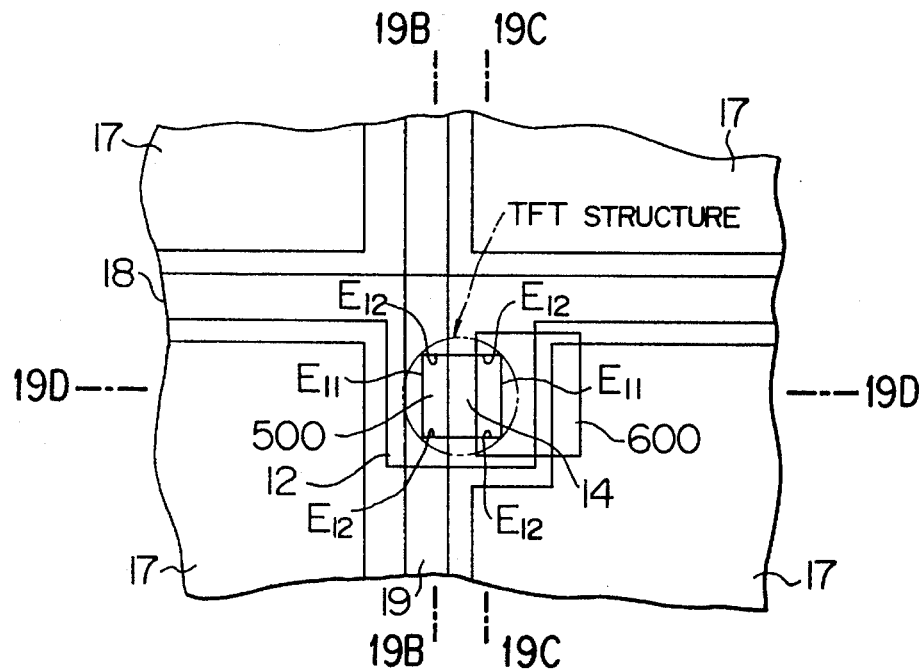
FIG. 19A is a fragmentary plan view of an active matrix circuit board according to an eleventh embodiment of the present invention.
Figure 19B:
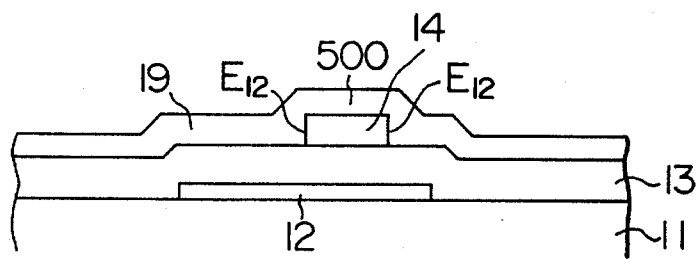
FIGS. 19B to 19D are sectional views showing a thin film transistor structure used in FIG. 19A.
Figure 19C:
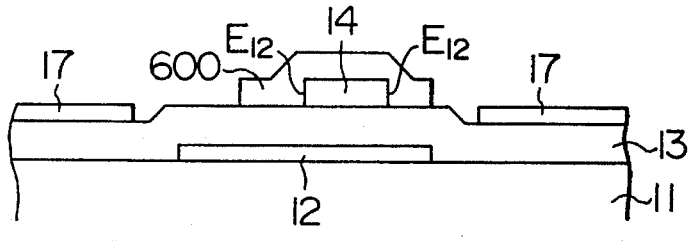
Figure 19D:
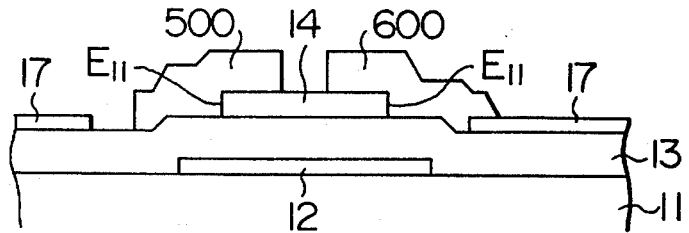

Thus, FIGS. 19A to 19D show essential parts of an active matrix circuit board according to an eleventh embodiment of the present invention. The active matrix circuit board uses a-Si TFT's as switching elements. Particularly, FIG. 19A is a plan view showing an a-Si TFT structure and its neighboring region, FIG. 19B iS a sectional view taken on the line XIXB—XIXB of FIG. 19A, FIG. 19C is a sectional view taken on the line XIXC—XIXC and FIG. 19D is a sectional view taken on the line XIXD—XIXD.

Referring to FIGS. 19A to 19D, the transistor structure has an insulating base plate 11 such as a glass plate, a control electrode (gate electrode) 12 comprised of a metal layer of, for example, chromium (Cr) and formed on a part of the base plate 11, a first insulating layer (gate insulating layer) 13 in the form of an insulating layer of, for example, silicon nitride which is formed on the control electrode 12 and on the base plate 11, a semiconductor layer (a-Si layer) 14 containing, for example, silicon as main constituent and formed on at least a part of insulating layer 13 which is on the control electrode 12, and first and second main electrodes (drain and source electrodes) 500 and 600 of, for example, aluminum (Al) which are so formed on the semiconductor layer 14 as to be spaced apart from each other.

The main electrodes 500 and 600 define, in cooperation with the control electrode 12, a channel in the semiconductor layer (active layer) 14 between the electrodes 500 and 600. As best seen in FIG. 19A, the active layer 14 has a first peripheral edge portion $E_{11}$ generally perpendicular to the direction of the channel and a second peripheral edge portion $E_{12}$ generally not perpendicular to the direction of the channel. Each of the main electrodes 500 and 600 (or alternately any one of the two main electrodes) extends over the second peripheral edge portion $E_{12}$ of the active layer 14 onto the insulating layer 13 such that at least a part of the second peripheral edge portion $E_{12}$ has its side surface directly converted with the electrode 500 or 600.

A display segment electrode 17 comprised of a transparent conductive layer of, for example, ITO (indium tin oxide: a mixture of indium oxide and tin oxide) is connected to the source electrode 600, a gate line (gate bus line or scanning line) 18 is connected to the control electrode (gate electrode) 12, and a drain line (drain bus line, signal line or data line) 19 is connected to the drain electrode 500. The TFT structure is encircled with a circle in FIG. 19A and its drain electrode 500 and source electrode 600 are sectioned along the direction of the channel as shown in FIG. 19D. The control electrode 12 is connected to the gate line 18 as shown in FIG. 19A and the first main electrode 500 is connected to the drain line 19 as shown in FIG. 19B. Thus, as best seen in FIG. 19B, the side surface of the second peripheral edge portion $E_{12}$ of a-Si layer 14 is covered directly with the drain electrode 500 and as best seen in FIG. 19C, the side surface of the second peripheral edge portion $E_{12}$ of a-Si layer 14 is also covered directly with the source electrode 600.

In this embodiment, the drain electrode 500 and/or the source electrode 600 contacts the a-Si layer 14 through its peripheral edge portions, and at least a part of one ($E_{12}$) of the peripheral edge portions not perpendicular to the direction of the channel is above the gate electrode 12 as shown in FIGS. 19B and 19C and has its side wall (side surface) covered directly with the drain electrode 500 and/or the source electrode 600. The second peripheral edge portion $E_{12}$ of the a-Si layer 14 is not always required to be covered with both the drain and source electrodes but may be covered either one of the two electrodes. With this construction, the channel width is equivalently increased and therefore the (channel width)/(channel length) ratio is increased to provide an increased on-current. The present embodiment has an additional structural feature. More particularly, as shown in FIG. 19D, for the a-Si TFT to have a mobility of about 1 $cm^2$/V.s, the a-Si layer 14 is patterned, as in the case of the first embodiment shown in FIG. 4B, to have a length in the channel direction which is shorter than that of the gate electrode 12 by at least the thickness of the a-Si layer 14 and the drain electrode 500 and source electrode 600, which overlie the a-Si layer, are formed.

Figure 20:
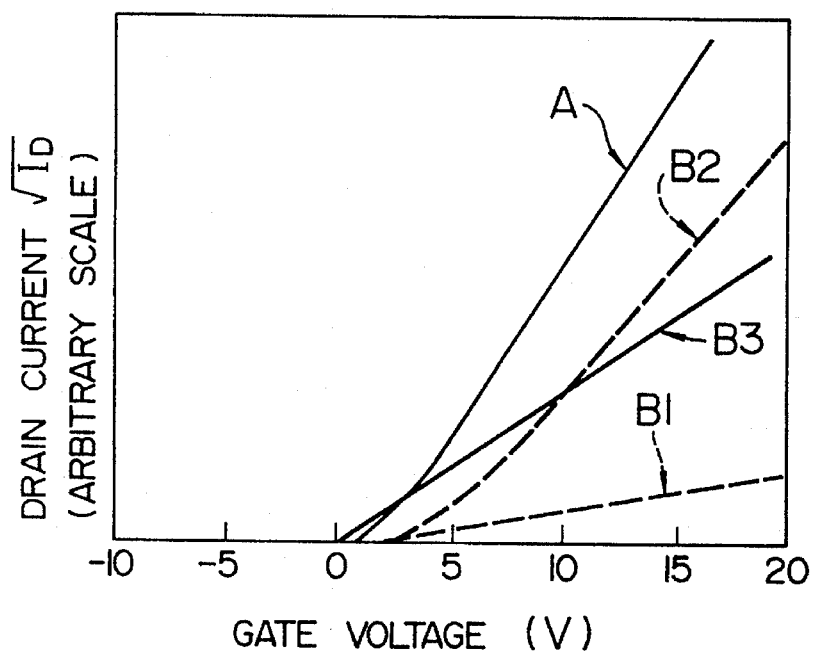
FIG. 20 is a graph showing a relation between the root of drain current and the gate voltage in the thin film transistor structure shown in FIGS. 19B to 19D.

FIG. 20 graphically exemplifies the relation between the root of drain current $\sqrt{I_D}$ and gate voltage (V) in a-Si TFT structures. In particular, curve A in FIG. 20 is representative of data obtained with such an a-Si TFT structure as shown in FIGS. 19A to 19D in accordance with the present embodiment, curve B1 is representative of data obtained with such a prior art a-Si TFT structure as shown in FIG. 1B, curve B2 is representative of data obtained with such a prior art a-Si TFT structure as shown in FIG. 1B which is additionally provided with $n^+$-type a-Si layers interposed between electrode 5 and active layer 4 and between electrode 6 and active layer 4, and curve B3 is representative of data obtained with such an a-Si TFT structure as shown in FIG. 4B (not provided with $n^+$-type a-Si layers for the electrodes). The curve A for the present embodiment of FIGS. 19A to 19D is obtained on condition that the a-Si layer 14 is of an island-like pattern of 100 μm×100 μm, the width (as measured perpendicularly to the direction of the channel) of each of the drain and source electrodes 500 and 600 is 120 μm and the spacing between the drain electrode 500 and source electrode 600 is 10 μm. The other curves B1 to B3 are obtained on condition that the a-Si layer 14 is of an island-like pattern of 120 μm (width)×100 μm (length), the width of drain and source electrodes (500, 600) is 100 μm and the spacing between the drain and source electrodes is 10 μm. The thickness of the a-Si layer 14 and that of the gate insulating layer are the same for all of the a-Si-TFT structures examined. Accordingly, in all the examined structures, the apparent channel width is 100 μm and the apparent channel length is 10 μm.

In the structure for the curve B3, although the channel width should be determined by the dimensions of the patterns of the drain electrode 500 and source electrode 600, it is actually determined by the length of the a-Si layer 14 measured in the direction of the channel because the contact resistance between the layer 14 and the metal layers constituting the drain electrode 500 and source electrode 600 is relatively large. For this reason, the (channel width)/(channel length) ratio is substantially 1 (one). The a-Si TFT structure according to the present embodiment of FIGS. 19A to 19D for the curve A is identical to the structure for the curve B3 with the only exception that the a-Si layer 14 is covered with each of the drain and source electrodes 500 and 600 in a different manner. In the structure for the curve B2, the additional $n^+$-type a-Si layer is effective to reduce contact resistance of the electrode and an effective mobility of 0.3 cm²/V.s can be obtained. In the structure for the curve B1, contact resistance of the electrode is large, limiting the effective mobility to about 0.01 to 0.02 cm²/V.s, and drain current $I_D$ is decreased greatly. In the structure for the curve B3, although the effective mobility can be 1 cm²/V.s, since the (channel width)/(channel length) ratio is one (both the channel width and the channel length being 100 μm), the drain current $I_D$ is lower at drain voltages of 10 V or more when compared to the drain current obtained with the structure for curve B2 having a (channel width)/(channel length) ratio amounting to ten (the channel width 100 μm, channel length 10 μm). However, with the structure for the curve B3, an increase in drain current $I_D$ can be expected by configuring the structure such that the channel length is limited to a certain degree.

According to the present embodiment described as above, of peripheral edge portions of the a-Si layer 14 through which the drain electrode 500 and source electrode 600 contact the a-Si layer 14, one peripheral edge portion is not perpendicular to the direction of the channel, and at least a part of this peripheral edge portion is above the gate electrode 12 and has its side surface covered directly with the drain electrode 500 and/or the source electrode 600, thereby ensuring that an increased on-current can be obtained in the a-Si TFT structure which is fabricated with the source working accuracy as that for the prior art structure. In addition, by decreasing the length of the a-Si layer 14 in the direction of the channel to further increase the (channel width)/(channel length) ratio, drain current (on-current) can further be increased.

Figure 21A:
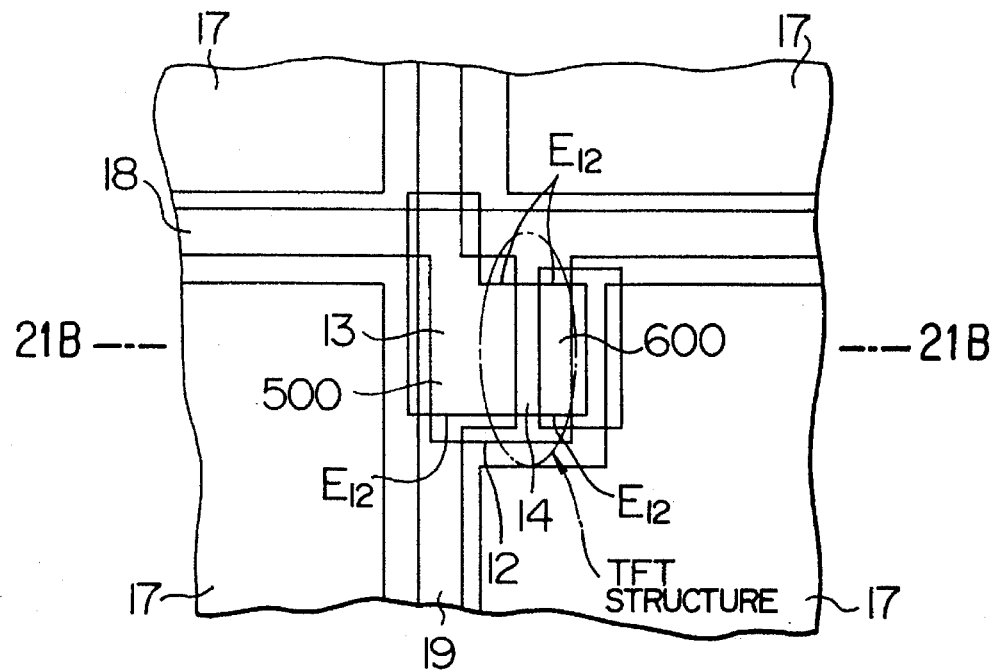
FIGS. 21A and 21B are fragmentary plan view and sectional view of an active matrix circuit board according to a twelfth embodiment of the present invention.
Figure 21B:
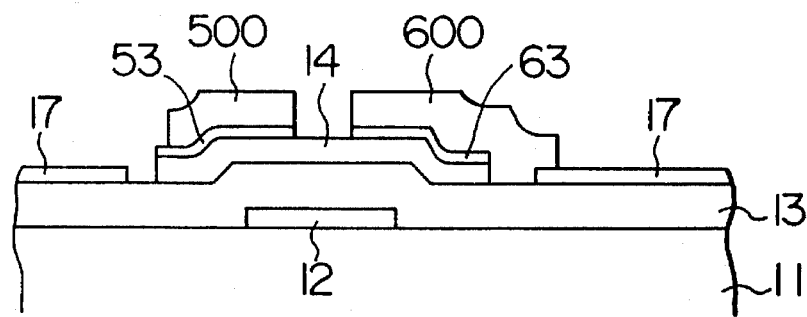

FIGS. 21A and 21B show an essential part of an active matrix circuit board according to a twelfth embodiment of the present invention. The active matrix circuit board uses a-Si TFT's as switching elements. Particularly, FIG. 21A is a plan view showing an a-Si TFT structure and its neighboring region, and FIG. 21B is a sectional view taken on the line XXIB—XXIB of FIG. 21A. In FIGS. 21A and 21B, reference characters like those in FIGS. 19A to 19D designate like elements. In this embodiment, an a-Si TFT structure is different from the previous structure shown, in sectional view form, in FIG. 19D in that an $n^+$-type silicon layer 53 is interposed between a-Si layer 14 and drain electrode 500 and an $n^+$-type silicon layer 63 is interposed between a-Si layer 14 and source electrode 600, and that the active layer 14 has a length in the channel direction which is larger than that of the control electrode (gate electrode) 12. In the TFT structure in this embodiment, too, that part $E_{12}$ of the peripheral edge portion of the a-Si layer 14 electrically contacting the drain electrode 500 and source electrode 600 which is not generally perpendicular to the direction of the channel is disposed above the gate electrode 12 as in the case of FIGS. 19B and 19C, and the peripheral edge portion $E_{12}$ has its side wall (side surface) covered directly with the drain electrode 500 and/or the source electrode 600, as shown in FIG. 21A.

In the present embodiment, since the length in the channel direction of the active layer 14 is larger than that of the control electrode 12 and the $n^+$-type a-Si layers 53 and 63 are provided for the drain contact (500) and source contact (600), the (channel width)/(channel length) ratio is generally determined by the dimensions of the patterns of the drain electrode 500 and source electrode 600. Namely, the electric contact between the a-Si layer 14 serving as an active layer and the drain electrode 500/source electrode 600 are attained via the $n^+$-type a-Si layers 53 and 63 between the upper surface of the a-Si layer 14 and the drain electrode 500/source electrode 600. With the structure, current is also allowed to flow across the side surface of the a-Si layer 14 which side surface extends in the direction of the channel, with a result that on-current is increased and its unevenness can be suppressed. Accordingly, a decrease of the on-current stemming from a bulk resistance of the a-Si layer 14 and contact resistance between the $n^+$-type a-Si layers 53, 63 and the drain and source electrodes 500, 600 and unevenness or variations among the TFT structures of the on-current can be effectively suppressed.

Figure 22A:
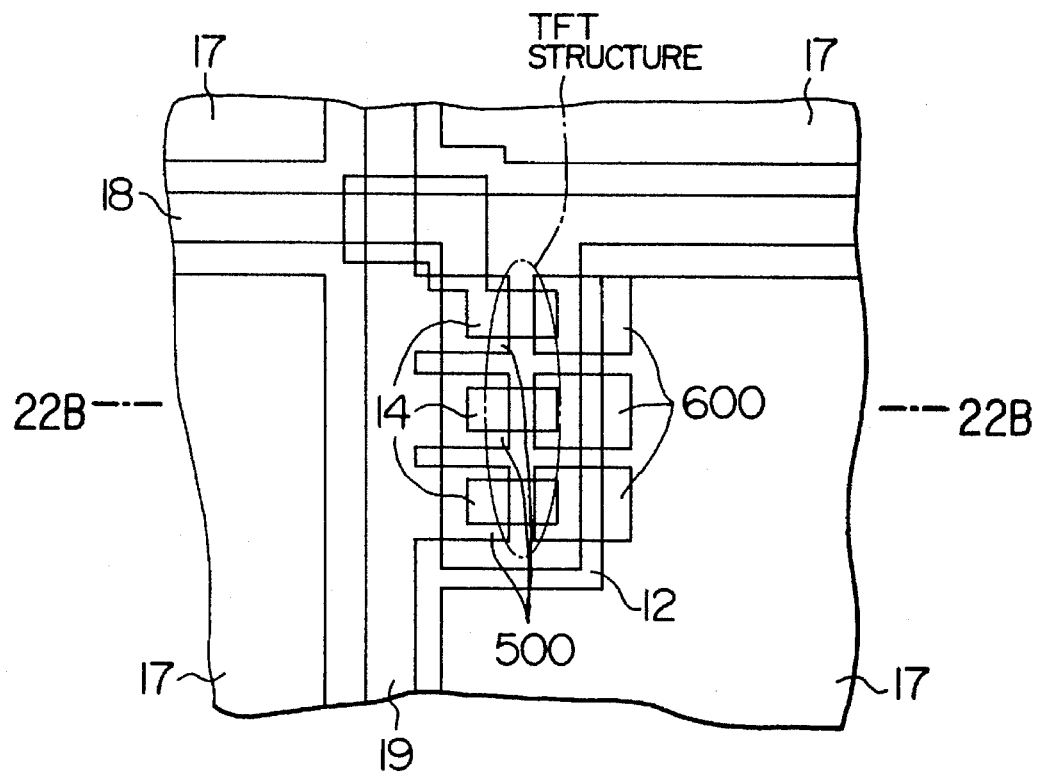
FIGS. 22A and 22B are fragmentary plan view and sectional view of an active matrix circuit board according to a thirteenth embodiment of the present invention.
Figure 22B:
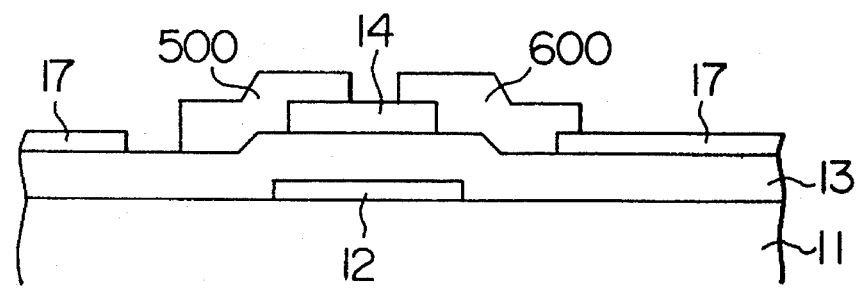

FIGS. 22A and 22B show essential part of an active matrix circuit board according to a thirteenth embodiment of the present invention. The active matrix circuit board uses a-Si TFT's as switching elements. Particularly, FIG. 22A is a plan view showing an a-Si TFT structure and its neighbouring region, and FIG. 22B is a sectional view taken on the line XXIIB—XXIIB of FIG. 21A. In this embodiment, the eleventh embodiment of FIGS. 19A to 19D is altered or modified in such a manner that a drain line 19 and a display segment electrode 17 are interconnected together through a plurality of (for example, three) a-Si TFT's. When a plurality of TFT's are connected in parallel in order to increase the (channel width)/(channel length) ratio and obtain an increased on-current as in the present embodiment, each TFT can have a channel width smaller than that of a single TFT of the single-TFT structure and to attain beneficial effect of the invention, technical teachings of the invention are applied to formation of the a-Si layer 14, drain electrode 500 and source electrode 600 so that each a-Si layer 14 has peripheral edge portions, at least a part of one ($E_{12}$) of the peripheral edge portions which is not perpendicular to the direction of the channel is above the gate electrode 12 and the peripheral edge portion $E_{12}$ has its side surface covered directly with the drain electrode 500 and/or the source electrode 600.

In comparison with the single-TFT structure having a relatively large (channel width)/(channel length) ratio, the structure shown in FIG. 22A in which the island pattern of the a-Si layer 14 is divided for forming a plurality of TFT's each having a smaller channel width and applied with the teachings or features described in connection with FIGS. 19A to 19D, is effective to further increase on-current. The reasons for this will be described below.

When considering a TFT structure having a semiconductor layer (a-Si layer) in which contact resistance between the semiconductor layer and each of the drain and source electrodes is large, the TFT structure shown in FIGS. 4A and 4B can typically portray the role of the former TFT structure. In the TFT structure, the channel width is substantially determined by the pattern size of each of the drain and source electrodes 15 and 16 and the channel length by the pattern size of the a-Si layer 14. Here, an instance where in a TFT structure according to the embodiment of FIGS. 4A and 4B the substantial (channel width)/(channel length) ratio is increased by adjusting the structural dimensions of the drain electrode 15, source electrode 16 and a-Si layer pattern 14 will be compared with an instance where in a TFT structure according to the embodiment of FIGS. 19A to 19D the a-Si layer pattern 14 is divided into, for example, three TFT's each having a smaller substantial (channel width)/(channel length) ratio as a result of adjustment of the structural dimensions of the drain electrode 500, source electrode 600 and a-Si layer pattern 14 and having its drain and source electrodes applied with teachings or features described in connection with FIGS. 19A to 19D. This comparison can demonstrate that the on-current can be further increased with ease in the TFT structure having the a-Si layer pattern 14 divided into a plurality of TFT's than in the TFT structure having a single TFT. As an example, a TFT structure is taken wherein each of the drain and source electrodes overlaps the gate electrode to provide a characteristic as represented by curve B shown in FIG. 20 and a substantial (channel width)/(channel length) ratio amounting to 4. Then, the a-Si layer pattern of this type of TFT structure is divided into three TFT's each having a substantial (channel width)/(channel length) ratio of 1 (one) and having its drain and source electrodes applied with the features described in connection with FIGS. 19A to 19D. In the resulting TFT structure, in spite of the fact that the area of each TFT is smaller, the substantial resultant (channel width)/(channel length) ratio of the three TFT's can amount up to about 15 because, as has been described in connection with the embodiment of FIGS. 19A to 19D, each TFT of the TFT structure is allowed to have a substantial (channel width)/(channel length) ratio of, for example, about 5. Further, off-current (leakage current) of each TFT is generally prone to increase as the apparent spacing between its drain and source electrodes decreases. However, in the present embodiment, even with the apparent spacing between the drain and source electrodes increased, the necessary on-current can be maintained and consequent suppression of off-current can be ensured.

Figure 23:
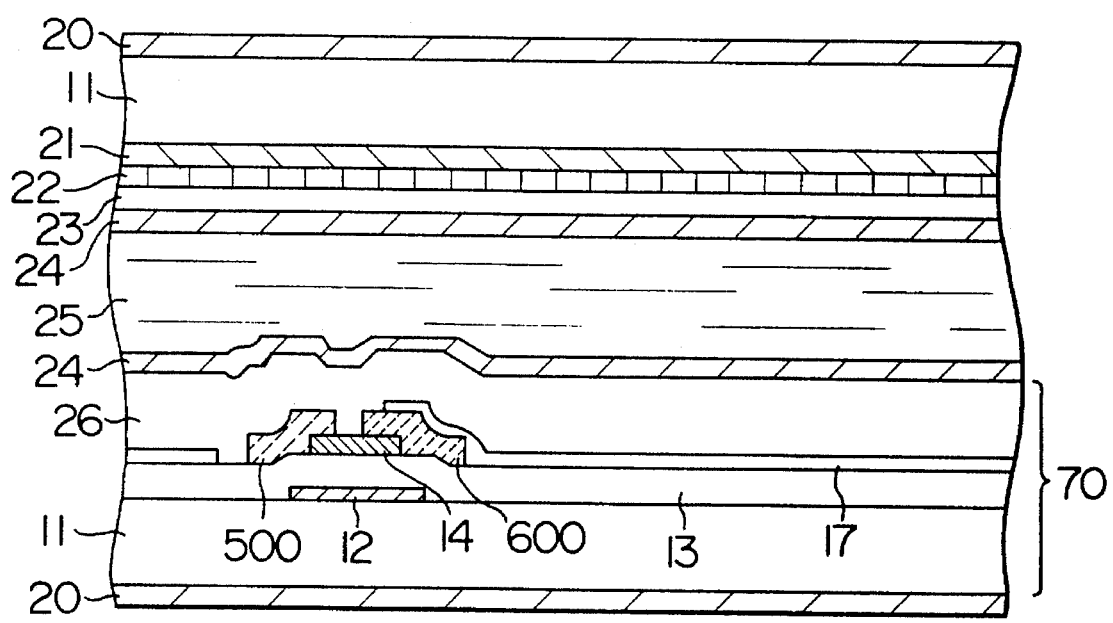
FIG. 23 is a fragmentary sectional view of an image display device according to a fourteenth embodiment of the present invention.

FIG. 23 shows, in sectional view form, essential part of an image display device according to a fourteenth embodiment of the present invention. The image display device uses an active matrix circuit board utilizing the TFT structure of the invention. In this embodiment, the image display device comprises an active matrix circuit board 70 including a-Si TFT structure of, for example, FIGS. 19A to 19D, each structure having elements 11 to 14, 17, 500 and 600 which are identical to those of FIGS. 19A to 19D, a polarizer plate 20, a color filter 21, an electrode 23 opposed to the display segment electrode 17 in the form of a transparent conductive layer and like the electrode 17 formed of a transparent conductive layer, protective layers 22 and 26, an orientation layer 24 and liquid crystal material 25 filled in a gap.

In this embodiment, the image display device is constructed as above and used for color display. This image display device can be manufactured easily through manufacture steps similar to those for well known color liquid crystal display devices. Practically, the display device comprises, in addition to the components shown in FIG. 23, image display driving means including a control system for various electric circuits and back illumination means but the image display driving means is well known and will not be described herein.

What is claimed is:

1. A thin film transistor structure comprising:

a base plate;

a control electrode layer formed on a part of said base plate;

an insulating layer formed on said control electrode layer and on said base plate;

an active layer of a semiconductor material formed on a part of said insulating layer which is on said control electrode layer; and first and second main electrode layers in an overlap relation to that surface of said active layer which is not on said insulating layer, said first and second main electrode layers being spaced from each other to define, in cooperation with said control electrode layer, a channel in said active layer between said first and second main electrode layers, in which said active layer having a first peripheral edge portion generally perpendicular to the direction of said channel and a second peripheral edge portion generally not perpendicular to the direction of said channel, and at least one of said first and second main electrode layers extending over said first peripheral edge portion of said active layer onto said insulating layer such that at least a part of said first peripheral edge portion of said active layer has its side face directly covered with said one main electrode layer and that a part of said one main electrode layer overlaps said control electrode only with said insulating layer lying therebetween, the length of said overlapping part of said one main electrode layer as measured in the direction of said channel being not smaller than the thickness of said active layer.

2. A matrix circuit board for use in driving a liquid crystal display elements, comprising a plurality of thin film transistor structures as defined in Claim 1, a plurality of first parallel bus lines provided on said board and a plurality of second parallel bus lines provided on said board and transverse to said first bus lines, in which said thin film transistor structures are arranged in the vicinity of intersections between said first and second bus lines, the control electrode layer and one of the first and second main electrodes of each of said thin film transistor structures being connected with its associated first and second bus lines, respectively.

3. An image display device comprising a matrix circuit board as defined in claim 2, a plurality of display segment electrodes formed on said board, at least one opposed electrode and liquid crystal material disposed between said display segment electrodes and said opposed electrode, the other main electrode of each of said thin film transistor structures being connected with different one of said display segment electrodes.

4. A thin film transistor structure according to claim 1, in which the structure further comprising a protective layer of an insulating material provided on said surface of said active layer which is not on said insulating layer so that said main electrode layers are spaced from each other on said protective layer.

5. A thin film transistor structure comprising:

a base plate;

a control electrode layer formed on a part of said base plate;

an insulating layer formed on said control electrode layer and on said base plate;

an active layer of a semiconductor material formed on a part of said insulating layer which is on said control electrode layer;

first and second main electrode layers formed above said active layer in a spaced relation to define, in cooperation with said control electrode layer, a channel in said active layer between said first and second main electrode layers; and first and second heavily doped semiconductor layers provided between said active layer and said first main electrode layer and between said active layer and said second main electrode layer, respectively, in which said active layer having a first peripheral edge portion generally perpendicular to the direction of said channel and a second peripheral edge portion generally not perpendicular to the direction of said channel, and at least one of said first and second main electrode layers and the underlying heavily doped semiconductor layer extending over said first peripheral edge portion of said active layer onto said insulating layer such that at least a part of said first peripheral edge portion of said active layer has its side face directly covered with said heavily doped layer and that a part of said one main electrode layer overlaps said control electrode only with said heavily doped layer and insulating layer lying therebetween, the length of said overlapping part of said one main electrode layer as measured in the direction of said channel being not smaller than the thickness of said active layer.

6. A thin film transistor structure according to claim 5, in which the structure further comprises a protective layer of an insulating material provided on said surface of said active layer which is not on said insulating layer.

7. A thin film transistor structure comprising:

a base plate;

a control electrode layer formed on a part of said base plate;

an insulating layer formed on said control electrode layer and on said base plate;

an active layer of a semiconductor material formed at least on a part of said insulating layer which is on said control electrode layer; and first and second main electrode layers in an overlap relation to that surface of said active layer which is not on said insulating layer, said first and second main electrode layers being spaced from each other to define, in cooperation with said control electrode layer, a channel in said active layer between said first and second main electrode layer, in which said active layer has a first peripheral edge portion generally perpendicular to the direction of said channel and a second peripheral edge portion generally not perpendicular to the direction of said channel, and at least one of said first and second main electrode layers extends over said second peripheral edge portion of said active layer onto said insulating layer such that at least a part of said second peripheral edge portion of said active layer has its side face directly covered with said at least one main electrode layer.

8. A thin film transistor structure according to claim 7, in which said at least one main electrode layer extends also over said first peripheral edge portion of said active layer such that at least a part of said first peripheral edge portion and at least a part of said second peripheral edge portion of said active layer have their side faces directly covered with said at least one main electrode layer.

9. A matrix circuit board for use in driving a liquid crystal display elements, comprising a plurality of thin film transistor structures as defined in claim 7, a plurality of first parallel bus lines provided on said board and a plurality of second parallel bus lines provided on said board and transverse to said first bus lines, in which said thin film transistor structures are arranged in the vicinity of intersections between said first and second bus lines, the control electrode layer and one of the first and second main electrodes of each of said thin film transistor structures being connected with its associated first and second bus lines, respectively.

10. An image display device comprising a matrix circuit board as defined in claim 9, a plurality of display segment electrodes formed on said board, at least one opposed electrode and liquid crystal material disposed between said display segment electrodes and said opposed electrode, the other main electrode of each of said thin film transistor structures being connected with different one of said display segment electrodes.

11. A thin film transistor structure comprising:

a base plate;

a control electrode layer formed on a part of said base plate;

an insulating layer formed on said control electrode layer and on said base plate;

an active layer of a semiconductor material formed on a part of said insulating layer which is on said control electrode layer;

first and second main electrode layers formed above said active layer in a spaced relation to define, in cooperation with said control electrode layer, a channel in said active layer between said first and second main electrode layers; and first and second heavily doped layers provided between said active layer and said first main electrode layer and between said active layer and said second main electrode layer, respectively, in which said active layer has a first peripheral edge portion generally perpendicular to the direction of said channel and a second peripheral edge portion generally not perpendicular to the direction of said channel, and at least one of said first and second main electrode layers and the underlying heavily doped layer extends over said second peripheral edge portion of said active layer onto said insulating layer such that at least a part of said second peripheral edge portion of said active layer has its side face directly covered with said heavily doped layer.

* * * * *

UNITED STATES PATENT AND TRADEMARK OFFICE
CERTIFICATE OF CORRECTION

PATENT NO. : 5,493,129
DATED : February 20, 1996
INVENTOR(S) : Eiji MATSUZAKI, et al.

It is certified that error appears in the above-indentified patent and that said Letters Patent is hereby corrected as shown below:

Column 1, line 24, delete "which" at end of line.

Column 1, line 25, delete "prevents".

Column 1, line 61, change "this" to --thin--.

Column 3, line 64, change "effect" to --effects--, and add --11.-- after "FIG." at end of line.

Column 4, lines 31 and 32, change "DESCRIPTION OF THE PREFERRED EMBODIMENTS" to --DETAILED DESCRIPTION--.

Column 4, line 49, delete "so".

Column 6, line 10, delete "present" before "distribution" and insert --present-- before "invention".

Column 12, line 59, after "covered" insert --by--.

Column 12, line 65, change "$cm^2/V.s,$" to --$cm^2/V \cdot s,$--.

Column 13, line 49, change "$cm^2/V.s,$" to --$cm^2/V \cdot s,$--.

Column 13, line 51, change "$cm^2/V.s,$" to --$cm^2/V \cdot s,$--.

UNITED STATES PATENT AND TRADEMARK OFFICE
CERTIFICATE OF CORRECTION

PATENT NO. : 5,493,129
DATED : February 20, 1996
INVENTOR(S) : Eiji MATSUZAKI, et al.

It is certified that error appears in the above-indentified patent and that said Letters Patent is hereby corrected as shown below:

```
Column 14, line 56, insert --an-- before "essential".

Column 16, line 59, delete "a" before "liquid".

Column 18, line 19, delete "a" before "liquid".
```

Signed and Sealed this

Eighth Day of October, 1996

Attest:

BRUCE LEHMAN

*Attesting Officer*         *Commissioner of Patents and Trademarks*